(12) United States Patent
Langguth et al.

(10) Patent No.: US 8,198,651 B2
(45) Date of Patent: Jun. 12, 2012

(54) ELECTRO STATIC DISCHARGE PROTECTION DEVICE

(75) Inventors: Gernot Langguth, Oberhaching (DE); Wolfgang Soldner, Unterhaching (DE); Cornelius Christian Russ, Diedorf (DE)

(73) Assignee: Infineon Technologies AG, Neubiberg (DE)

( * ) Notice: Subject to any disclaimer, the term of this patent is extended or adjusted under 35 U.S.C. 154(b) by 558 days.

(21) Appl. No.: 12/250,436

(22) Filed: Oct. 13, 2008

(65) Prior Publication Data

US 2010/0090283 A1    Apr. 15, 2010

(51) Int. Cl.
*H01L 29/02* (2006.01)
(52) U.S. Cl. ........ 257/170; 257/127; 257/409; 257/452; 257/484; 257/490; 257/494; 257/495; 257/605; 257/355; 257/360
(58) Field of Classification Search ............... 361/56, 361/91.1, 111; 257/360, 355
See application file for complete search history.

(56) References Cited

U.S. PATENT DOCUMENTS

| | | | |
|---|---|---|---|
| 3,246,172 A | 4/1966 | Sanford | |
| 4,089,024 A | 5/1978 | Tanaka | |
| 5,237,395 A | 8/1993 | Lee | |
| 5,440,151 A | 8/1995 | Crevel et al. | |
| 5,637,892 A | 6/1997 | Leach | |
| 5,682,047 A | 10/1997 | Consiglio et al. | |
| 5,721,439 A | 2/1998 | Lin | |
| 5,895,940 A | 4/1999 | Kim | |
| 5,905,288 A | 5/1999 | Ker | |
| 6,081,002 A | 6/2000 | Amerasekera et al. | |
| 6,441,437 B1 | 8/2002 | Gossner | |
| 6,750,575 B2 | 6/2004 | Wright | |
| 6,912,109 B1 | 6/2005 | Ker et al. | |

(Continued)

FOREIGN PATENT DOCUMENTS

DE    197 20 374 A1    11/1997

OTHER PUBLICATIONS

Ker, et al., *Native-NMOS-Triggered SCR With Faster Turn-On Speed for Effective ESD Protection in a 0.13-µm CMOS Process*, IEEE Transactions on Device and Materials Reliability, vol. 5, No. 3, Sep. 2005.

(Continued)

*Primary Examiner* — Ha Tran T Nguyen
*Assistant Examiner* — Aaron Dehne
(74) *Attorney, Agent, or Firm* — Slater & Matsil, L.L.P.

(57) ABSTRACT

A semiconductor device for protecting against an electro static discharge is disclosed. In one embodiment, the semiconductor device includes a first low doped region disposed in a substrate, a first heavily doped region disposed within the first low doped region, the first heavily doped region comprising a first conductivity type, and the first low doped region comprising a second conductivity type, the first and the second conductivity types being opposite, the first heavily doped region being coupled to a node to be protected. The semiconductor device further includes a second heavily doped region coupled to a first power supply potential node, the second heavily doped region being separated from the first heavily doped region by a portion of the first low doped region, and a second low doped region disposed adjacent the first low doped region, the second low doped region comprising the first conductivity type. A third heavily doped region is disposed in the second low doped region, the third heavily doped region comprising the second conductivity type and being coupled to a second power supply potential node.

62 Claims, 13 Drawing Sheets

U.S. PATENT DOCUMENTS

| | | |
|---|---|---|
| 7,317,603 B2 | 1/2008 | Fischer et al. |
| 2005/0195540 A1 | 9/2005 | Streibl et al. |
| 2005/0270710 A1 | 12/2005 | Ker et al. |
| 2005/0286188 A1 | 12/2005 | Camp et al. |
| 2008/0174924 A1* | 7/2008 | Kang et al. ............... 361/56 |
| 2008/0198519 A1* | 8/2008 | Lim ........................... 361/56 |
| 2008/0285190 A1* | 11/2008 | Okushima ................. 361/56 |

OTHER PUBLICATIONS

Ker, et al., *Implementation of Initial-On ESD Protection Concept With PMOS-Triggered SCR Devices in Deep-Submicron CMOS Technology,* IEEE Journal of Solid-State Circuits, vol. 42, No. 5, May 2007.

* cited by examiner

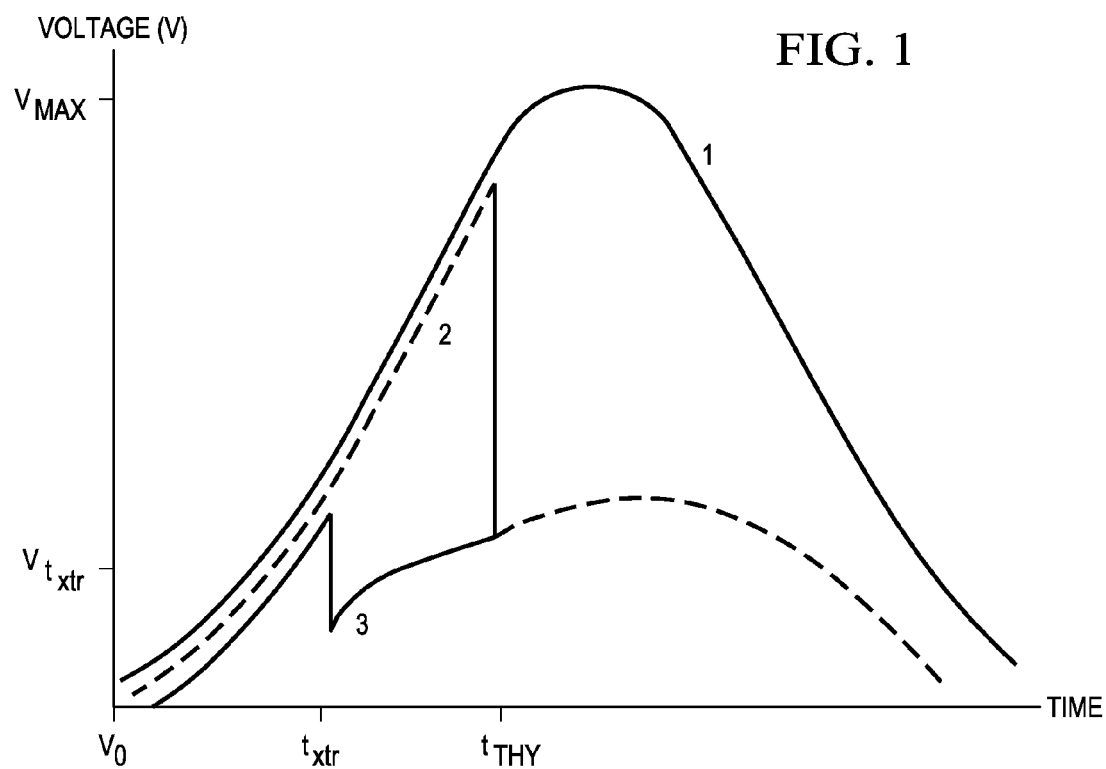
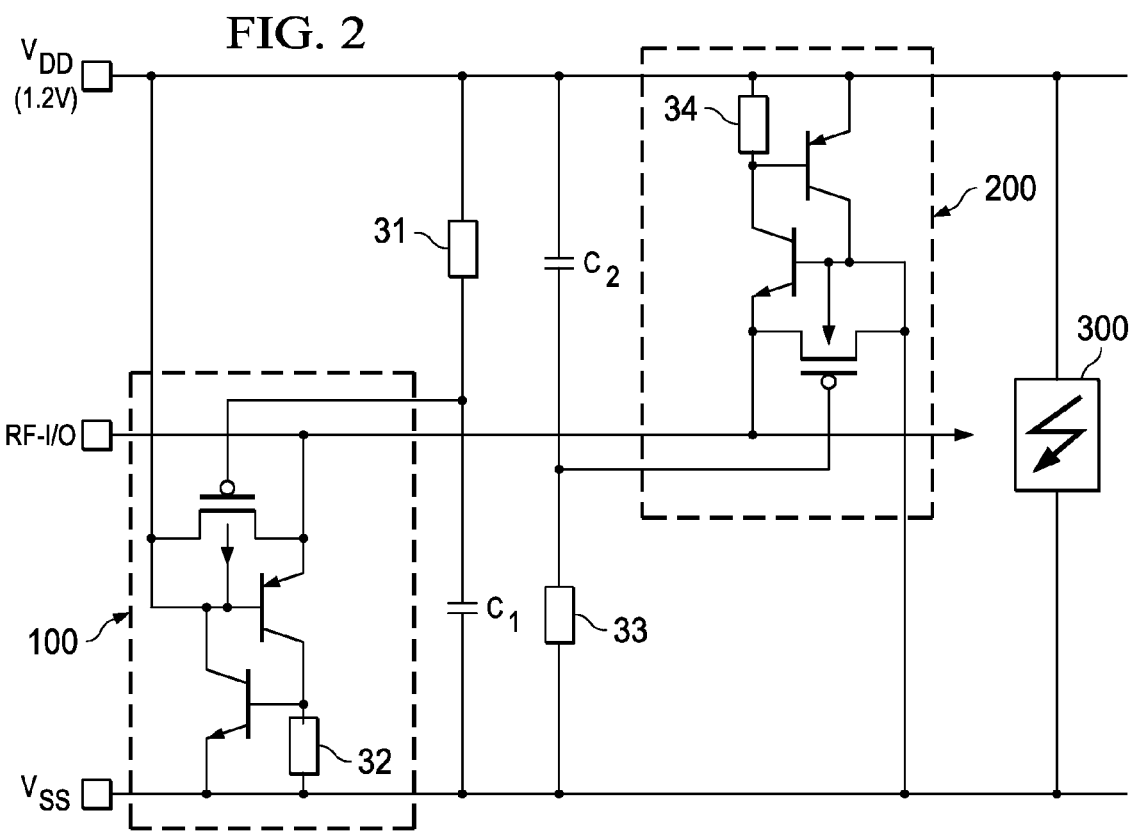

ELECTRO STATIC DISCHARGE PROTECTION DEVICE

TECHNICAL FIELD

The present invention relates generally to electro static discharge, and more particularly to a semiconductor device for protecting against electro static discharge.

BACKGROUND

As electronic components are getting smaller and smaller, along with the internal structures in integrated circuits, it is getting easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials or voltages, caused by direct contact or induced by an electrostatic field. The discharge of static electricity, or ESD, has become a critical problem for the electronics industry.

Device failure resulting from ESD events are not always immediately catastrophic or apparent. Often the device is only slightly weakened, but is less able to withstand normal operating stresses. Such a weakened device may result in reliability problems. Therefore, various ESD protection circuits should be included in an integrated circuit to protect its various components.

When an ESD pulse occurs on a transistor, the extremely high voltage of the ESD pulse can break down the transistor and can potentially cause permanent damage. Consequently, the circuits associated with the input/output pads of an integrated circuit need to be protected from ESD pulses to prevent such damage.

Integrated circuits, and the geometry of the transistors that make up the integrated circuits, continue to be reduced in size and the transistors are arranged closer together. A transistor's physical size limits the voltage that the transistor can withstand without being damaged. Thus, breakdown voltages of transistors are lowered and currents capable of overheating components are more frequently reached by the voltages and currents induced by an ESD event.

In order to remedy problems with lower device yields stemming from ESD events, the semiconductor industry has recommended a number of different ESD event models to be used for ESD test criteria and design goals. One of these ESD event models, the charged device model (CDM), models rapid ESD events likely to occur during the semiconductor manufacturing and handling process. The ESD events modeled by CDM represent instantaneous discharge. Such an ESD event may consist of a peak current a few Amps and may last for about 1 ns with a rise time of about 200 ps.

Designing an ESD device for CDM events is challenging because most ESD devices show a rise-time dependent turn-on behavior. This behavior leads to voltage overshoots as long as the ESD device is not fully triggered. These voltage overshoots are especially pronounced for pulses with short rise-times and may destroy e.g. gate oxides connected to the node to be protected. This problem becomes especially critical for specific pads where, due to performance reasons, thin gate oxides have to be connected without any secondary ESD protection. Thus, there is a need for ESD protection devices that can be rapidly triggered, yet still conduct large currents.

SUMMARY OF THE INVENTION

These and other problems are generally solved or circumvented, and technical advantages are generally achieved, by preferred embodiments of the present invention.

Embodiments of the invention include semiconductor devices that prevent damage from electro static discharge. In accordance with a preferred embodiment of the present invention, a semiconductor device comprises a first low doped region disposed in a substrate, a first heavily doped region disposed within the first low doped region, the first heavily doped region comprising a first conductivity type, and the first low doped region comprising a second conductivity type, the first and the second conductivity types being opposite, the first heavily doped region being coupled to a node to be protected. The semiconductor device further comprises a second heavily doped region coupled to a first power supply potential node, the second heavily doped region being separated from the first heavily doped region by a portion of the first low doped region, and a second low doped region disposed adjacent the first low doped region, the second low doped region comprising the first conductivity type. A third heavily doped region is disposed in the second low doped region, the third heavily doped region comprising the second conductivity type and being coupled to a second power supply potential node.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 depicts a schematic illustration of an electro static discharge pulse (curve 1), the turn on times for a standard thyristor (curve 2), and a transistor enhanced thyristor in accordance with embodiments of the invention (curve 3);

FIG. 2 is a schematic illustration of an embodiment of the invention illustrating transistor enhanced thyristors coupled between all the power supply and input/output nodes of a semiconductor circuit, in accordance with embodiments of the invention;

FIG. 6, which includes FIGS. 6a and 6b, is a cross sectional view of a tunnel transistor enhanced thyristor, wherein FIG. 6a illustrates a positive ESD stress, and FIG. 6b illustrates a negative ESD stress, in accordance with an embodiment of the invention;

FIG. 7, which includes

FIG. 8, which includes FIG. 8a illustrates a cross sectional view, and FIG. 8b illustrates a schematic circuit, in accordance with an embodiment of the invention;

FIG. 9, which includes FIGS. 9a-9c, illustrates a power clamp transistor enhanced thyristor for positive ESD stress utilizing both a p-channel and an n-channel MOS transistor as fast discharge path and an external trigger device for the thyristor, wherein FIG. 9a illustrates a cross sectional view, and FIGS. 9b and 9c illustrates schematic circuits with an external NMOS and PMOS transistor respectively, in accordance with an embodiment of the invention; and FIG. 10, which includes FIGS. 10a and 10b, illustrates a power clamp transistor enhanced thyristor utilizing a p-channel MOS transistor as fast discharge path for positive ESD stress and an n-channel MOS transistor as fast discharge path for negative ESD stress as well as an external trigger device for the thyristor, wherein FIG. 10a illustrates a cross sectional view, and FIG. 10b illustrates a schematic circuit, in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
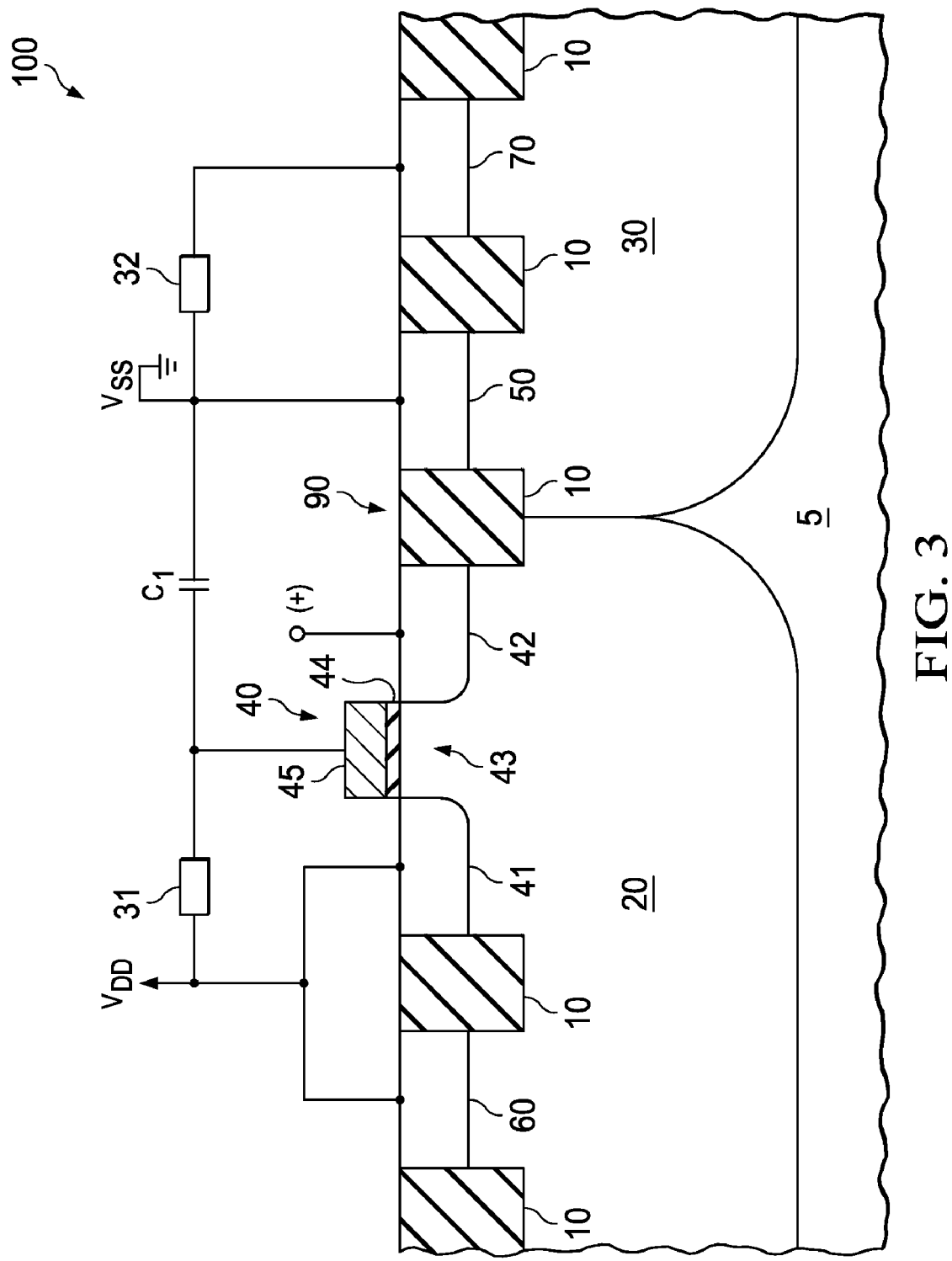
FIG. 3 is a cross sectional view of a transistor enhanced thyristor for positive ESD stress in accordance with an embodiment of the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device for protection against electrostatic discharge. The invention may also be applied, however, to other uses as well as to protect against other failure mechanisms.

One way of protecting against a fast ESD pulse involves the use of diodes mounted in reverse mode between the input pads and the power supply terminals (e.g., drain voltage ($V_{DD}$) node or supply and/or source voltage ($V_{SS}$) node). In advanced CMOS products ESD protection diodes are mainly operated in forward bias direction. Hence, the serial voltage of the forward biased diode, the bus resistance and the power clamp has to be lower than the transistor breakdown voltage. The ESD design window is the gap between clamping voltage and transistor breakdown voltage. The ESD design window decreases for advanced CMOS technologies. A serial resistor in combination with a secondary protection stage is added to overcome this limitation. However, this approach results in a performance impact due to the additional resistive and capacitive parasitics, and is not preferable in low noise radio frequency input/output devices (RF-I/Os) operating at frequencies greater than about 1 GHz.

Another way of solving this problem requires the use of MOS transistors in parallel with the input/output nodes. However, this approach also severely degrades the performance of the RF-I/Os due to the larger capacitance as well as the large transistor area required. Alternately, a small transistor may be used as the small transistor would require minimal area and capacitance. However, the small transistor would itself be susceptible to breakdown and thermal damage, thus providing insufficient ESD robustness.

Another solution involves the use of diodes bound by polysilicon regions instead of diodes isolated by isolation in combination with rail-based power clamps. However, this approach again involves an area penalty along with the added parasitic capacitance due to the additional junctions.

A different approach involves the use of thyristors. However, thyristors are slower to turn on and are triggered only after the ESD pulse attains a high voltage. Hence, thyristors are effective to protect against the medium pulse or latter part of an ESD pulse. For example, they are triggered only after a few hundred pico seconds whereas a typical charge device model CDM ESD pulse as illustrated in FIG. 1 peaks at about 100-500 ps. Hence, they are ineffective from shielding the initial fast transient (less than few hundred pico seconds) of the ESD pulse.

In various embodiments, the present invention overcomes these limitations by incorporating a transistor and a thyristor in a new device. The transistor is designed to trigger rapidly in the tens of pico-second range typical of fast switching CMOS transistors. The thyristor is triggered subsequently (for example, after several 100 ps) and provides a lower resistance path for pulse lengths above 1 ns, and hence protects the transistor from being damaged.

FIG. 1 is a schematic illustration of an ESD pulse in view of the integrated transistor-thyristor device according to embodiments of the invention. A schematic circuit illustrating integrated transistor-thyristor devices will be described using FIG. 2 in accordance with embodiments of the invention. Structural embodiments of transistor enhanced thyristors designed for protecting from positive ESD stress will be described using FIGS. 3 and 4, whereas structural embodiments of transistor enhanced thyristors for protecting from negative ESD stress will be described using FIG. 5. Structural embodiments of transistor enhanced thyristors adapted as power clamps will be described with respect to FIGS. 8, 9 and 10.

FIG. 1 shows a schematic illustration of an ESD pulse in view of the integrated transistor-thyristor device according to embodiments of the invention. Curve 1 shows a reference ESD pulse typical of CDM. An ESD protection circuit comprising a thyristor is illustrated with Curve 2. As the voltage increases beyond a threshold voltage, the thyristor is triggered after an elapse of time $t_{THY}$. The low resistive parallel path provided by the thyristor results in a flow of current through the thyristor and protects sensitive circuitry. However, the thyristor is triggered only after a portion of the ESD pulse is transmitted. Hence, the thyristor does not protect the sensitive circuits before this time ($t_{THY}$). In an integrated transistor thyristor device, the transistor turns on at an earlier time ($t_{xtr}$) (an earlier voltage ($Vt_{xtr}$)) than the thyristor yielding the curve 3. The transistor provides another alternate discharge path for the initial portion of the ESD pulse. Hence, the ESD pulse is effectively shielded from sensitive circuits using both the transistor and the thyristor.

FIG. 2 illustrates a circuit diagram of the integrated transistor-thyristor device in accordance with embodiments of the invention. The first ESD device 100 builds a discharge path for positive ESD stress at the RF I/O pads. The first ESD device 100 dissipates the energy of the pulse through the power supply nodes (e.g. drain voltage ($V_{DD}$) node or supply and/or source voltage ($V_{SS}$) node). The first ESD device 100 is connected between the RF-I/O and the $V_{SS}$ node.

Referring to FIG. 2 and the first ESD device 100, the drain/source (first diffusion region) of a transistor is coupled to the RF I/O node (the node to be protected). The transistor is a PMOSFET transistor in one embodiment. The source/drain (second diffusion region) of the transistor is coupled to the $V_{DD}$ node. The source/drain (second diffusion region) is further coupled to the body of the transistor. The gate of the transistor is coupled to an RC circuit wherein the first resistor R is connected to $V_{DD}$ and the capacitor C is connected to $V_{SS}$. A thyristor comprising a PNP and an NPN bipolar junction transistor is disposed between the RF I/O node and the $V_{SS}$ node. The anode of the thyristor is coupled to the RF I/O node whereas the cathode of the thyristor is coupled to the $V_{SS}$ node. The base of the PNP bipolar transistor of the thyristor is formed by the well of the transistor and is coupled to the $V_{DD}$ node. In the presence of a positive ESD pulse at the RF I/O node, the transistor is triggered and forms a first fast discharge path to the $V_{DD}$ node. The emitter based diode of the PNP forms a second discharge path to the $V_{DD}$ node. Subsequently, the thyristor is triggered forming a third discharge path into the $V_{SS}$ node.

The second ESD device 200 is coupled between the RF-I/O pads and $V_{DD}$. The second ESD device 200 provides a discharge path for negative stress values relative to $V_{DD}$ or $V_{SS}$ node, wherein the trigger current is provided by a displacement current via the PNP emitter base diode to $V_{DD}$ and then by the buffer cap or power clamp from $V_{DD}$ and $V_{SS}$.

Referring to FIG. 2 and the second ESD device 200, the source of a transistor is coupled to the RF I/O node (the node to be protected). In one embodiment, the transistor comprises a NMOSFET. The source/drain (first diffusion region) of the transistor is coupled to the $V_{SS}$ node. The source/drain is further coupled to the body of the transistor. The gate of the transistor is coupled an RC circuit wherein the first resistor R is connected to $V_{SS}$ and the C is connected to $V_{DD}$. A NPNP thyristor comprising a NPN and a PNP bipolar junction transistor is disposed between the RF I/O node and the $V_{DD}$ node. The cathode of the thyristor is coupled to the RF I/O node whereas the anode of the thyristor is coupled to the $V_{DD}$ node. The base of the NPN bipolar transistor of the thyristor is formed by the body of the transistor and is coupled to the $V_{SS}$ node. In the presence of a negative ESD pulse at the RF I/O node, the transistor is triggered and forms a first fast discharge path to the $V_{SS}$ node. The emitter base diode of the NPN forms a second discharge path to the $V_{SS}$ node. Subsequently, the thyristor is triggered forming a third discharge path into the $V_{DD}$ node, wherein the trigger current is provided by a displacement current via the NPN emitter base diode to $V_{SS}$ and then the buffer cap or power clamp from $V_{SS}$ and $V_{DD}$.

The third ESD device 300 is a power clamp device and coupled between the $V_{DD}$ node and the $V_{SS}$ node. The protection device between $V_{DD}$ and $V_{SS}$ nodes includes an additional fast reverse diode, for example, a diode comprising P+/P−/N+ layers (not shown in FIG. 2). The third ESD protection device 300 comprises a transistor and a thyristor in parallel forming a first and a second discharge path between the $V_{DD}$ and the $V_{SS}$ nodes. The third ESD protection device 300 is described in FIGS. 8, 9 and 10.

FIG. 3 illustrates a cross sectional view of an ESD protection device comprising a PMOS and a thyristor in an embodiment of the invention. The ESD protection device is illustrated as the first ESD device 100 in FIG. 2.

As illustrated in FIG. 3, a PMOS transistor 40 and a PNPN thyristor 90 are disposed on the substrate 5. Referring to FIG. 3, isolation regions 10 are embedded in the substrate 5, and electrically isolate the doped regions.

A first well region 20 is disposed in the substrate 5 and comprises a low doped n-type region. In various embodiments, the first well region 20 is doped to a concentration of about $5\times10^{16}$ cm$^{-3}$ to about $5\times10^{18}$ cm$^{-3}$, and about $5\times10^{17}$ cm$^{-3}$ in one embodiment.

A first doped region 41 and a second doped region 42 form the source/drain region of the PMOS transistor 40. The first and the second doped regions 41 and 42 are thus doped to be a heavily doped p$^+$ region. The first and the second doped regions 41 and 42 may be doped with boron wherein the doping is greater than about $1\times10^{19}$ cm$^{-3}$, and higher than about $1\times10^{20}$ cm$^{-3}$ in one embodiment. In various embodiments, the first and the second doped regions 41 and 42 comprise a doping such that the Fermi level is within about 0.1 eV from the valence band of the substrate 5.

A gate stack comprising a gate dielectric 44 and a PMOS gate electrode 45 are formed over the channel region 43. The PMOS gate electrode 45 is a heavily doped p-type semiconductor region, and is degenerately doped in one embodiment. In other embodiments, the PMOS gate electrode 45 comprises a metal gate with a band edge work function, for example, greater than at least 4.9 eV. The channel region 43 is disposed within the first well region 20 forming the PMOS transistor 40.

A second well region 30 is disposed adjacent the first well region 20. The second well region 30 comprises a low doped p-type region. In various embodiments, the second well region 30 is doped to a concentration of about $5\times10^{16}$ cm$^{-3}$ to about $5\times10^{18}$ cm$^{-3}$, and about $5\times10^{17}$ cm$^{-3}$ in one embodiment.

A third doped region 50 is formed on the second well region 30. The third doped region 50 comprises a low resistance layer, and preferably comprises an n-type doping greater than about $1\times10^{19}$ cm$^{-3}$, and higher than about $1\times10^{20}$ cm$^{-3}$ in one embodiment.

A fourth doped region 60 and a fifth doped region 70 form the contacts to the first and the second well regions 20 and 30 and are of same doping type respectively. The second doped region 42, the first well region 20, the second well region 30, and the third doped region 50 form the thyristor 50. The thyristor is hence formed from a layer sequence comprising p$^+$/n/p/n$^+$ layers.

As illustrated, the second doped region 42 forms both the drain 42 of the PMOS transistor 40 and the anode of the PNPN thyristor 90. The drain 42 of the transistor 40 and the anode of the thyristor 50 are coupled to the RF-I/O pads, and hence subject to the ESD pulse. The first doped region 41 (source) of the transistor 40 is further coupled to the first well region 20 through the fourth doped region 60. Hence, the body and source of the PMOS transistor are tied together.

The PMOS gate electrode 45 is tied to the body and the source 41 of the PMOS through a first resistor 31 and to the $V_{DD}$ node. The PMOS gate electrode 45 is further tied through a first capacitor $C_1$ to $V_{SS}$. The substrate contact of the PNPN thyristor 90 (fifth doped region 70) is coupled to the cathode of the PNPN thyristor 90 (third doped region 50) through a second resistor 32 to minimize sensitivity to small potential variations.

On applying a positive stress on the source of the PMOS transistor 40 (second doped region 42), a depletion region is formed under the gate dielectric 44 in the channel region 43. After sufficient positive stress on the second doped region 42, an inversion region is formed immediately underneath the gate dielectric 44, especially due to the first capacitor $C_1$ which ties the gate potential to $V_{SS}$. Hence, the PMOS transistor 40 is triggered and creates a first fast discharge path for the ESD pulse. The discharge path is provided by the PMOS towards $V_{DD}$ when the $V_{DD}$ node is grounded, while the discharge path is provided by the PMOS and the power clamp in serial connection when the $V_{SS}$ node is grounded. The discharge current (hole current) through the MOS transistor can be increased by increasing the saturation current, for example, by increasing the width or reducing the length of the transistor. Other scaling techniques may also be adopted to increase or decrease the current through the transistor to minimize damage to the junctions or to the gate dielectric 44 while maximizing the discharge current and minimizing the time to trigger the MOS transistor. However, for a given transistor design, the maximum discharge current through the MOS transistor is a finite value. The transistor is susceptible to breakdown if the voltage increases well beyond saturation.

The positive ESD pulse forward biases the p-n junctions between the second doped region 42 and the first well region 20, and the p-n junction between the second well region 30 and the third doped region 50. However, the p-n junction between the first well region 20 and the second well region 30 is reverse biased.

The forward biased p-n junction between the second doped region 42 and the first well region 20 or the fourth doped region 60 creates a second discharge path to $V_{DD}$ when the $V_{DD}$ node is grounded. When the $V_{SS}$ node is grounded, a displacement current flows via the forward biased p-n junction (from the second doped region 42 to the fourth doped region 60 via the first well region 20) to $V_{DD}$ and then through the buffer cap or power clamp from $V_{DD}$ to $V_{SS}$.

The displacement current flows during the rising edge of the pulse and leads to a triggering of the thyristor 90. Thus, after the triggering of the thyristor 90, a discharge current flows through the PNPN thyristor 90 to $V_{SS}$. The thyristor current flows from the second doped region 42 to the third doped region 50 through the first and the second well regions 20 and 30.

Although the PMOS transistor provides a fast turn-on, the PMOS transistor 40 is prone to be damaged at higher voltages attained during the ESD pulse. In various embodiments, the thyristor is triggered before the ESD pulse voltage reaches a maximum value, but after the PMOS transistor is triggered. The PNPN thyristor 90 provides a lower resistance discharge path than the PMOS transistor 40. Hence, the turn-on of the PNPN thyristor 90 prevents the breakdown of the PMOS transistor 40 when the ESD pulse reaches a maximum voltage The semiconductor devices described above are manufactured using typical semiconductor manufacturing processes. In one embodiment, isolation regions 10 are first formed. The first and the second well regions 20 and 30 are formed within the substrate 5, for example, by implanting n-type and p-type doping and annealing. By a photomask, the gate stack is formed in a portion over the first well region 20 forming the PMOS gate electrode 45.

The first and the second doped regions 41 and 42 (source and drain) are formed after forming suitable spacers around the gate stack. The fifth doped region 70 is also formed and co-implanted with the first and the second doped regions 41 and 42. Using suitable masking steps, the first and the second well regions 20 and 30 are masked and implanted through openings in the respective masks. In another embodiment, the fabrication steps comprises forming the first and the second doped regions 41 and 42 after forming the first and the second well regions 20 and 30. In one embodiment, the fabrication follows forming the first well region 20, and then the second well region 30, although alternately the second well region 30 can be formed before forming the first well region 20. Using a suitable process such as implantation, the third doped region 50 and fourth doped region 60 are formed together. In various embodiments, the heavier doped regions are formed later. In one embodiment, the first and the second doped regions 41 and 42 are formed after forming the third doped region 50 and fourth doped region 60. Conductive contacts to the first through fifth doped region 41, 42, 50, 60, and 70 are formed, for example, by silicidation.

The method continues through the interconnect metallization to interconnect the various terminals of the device. The metal lines and vias are formed so as to couple the second doped region 42 to a pad for coupling to the RF I/O node and active sensitive circuitry. The first doped region 41 is coupled to a first power supply potential node. The first doped region 41 is also coupled to the fourth doped region 60 and hence to the first well region 20. The PMOS gate electrode 45 is coupled to the first capacitor $C_1$ and the resistor 31. The third doped region 50 and the first capacitor $C_1$ are coupled to the $V_{SS}$ node while the first and the fourth doped regions 41 and 60 as well as the first resistor 31 are coupled to the $V_{DD}$ node.

Figure 4:
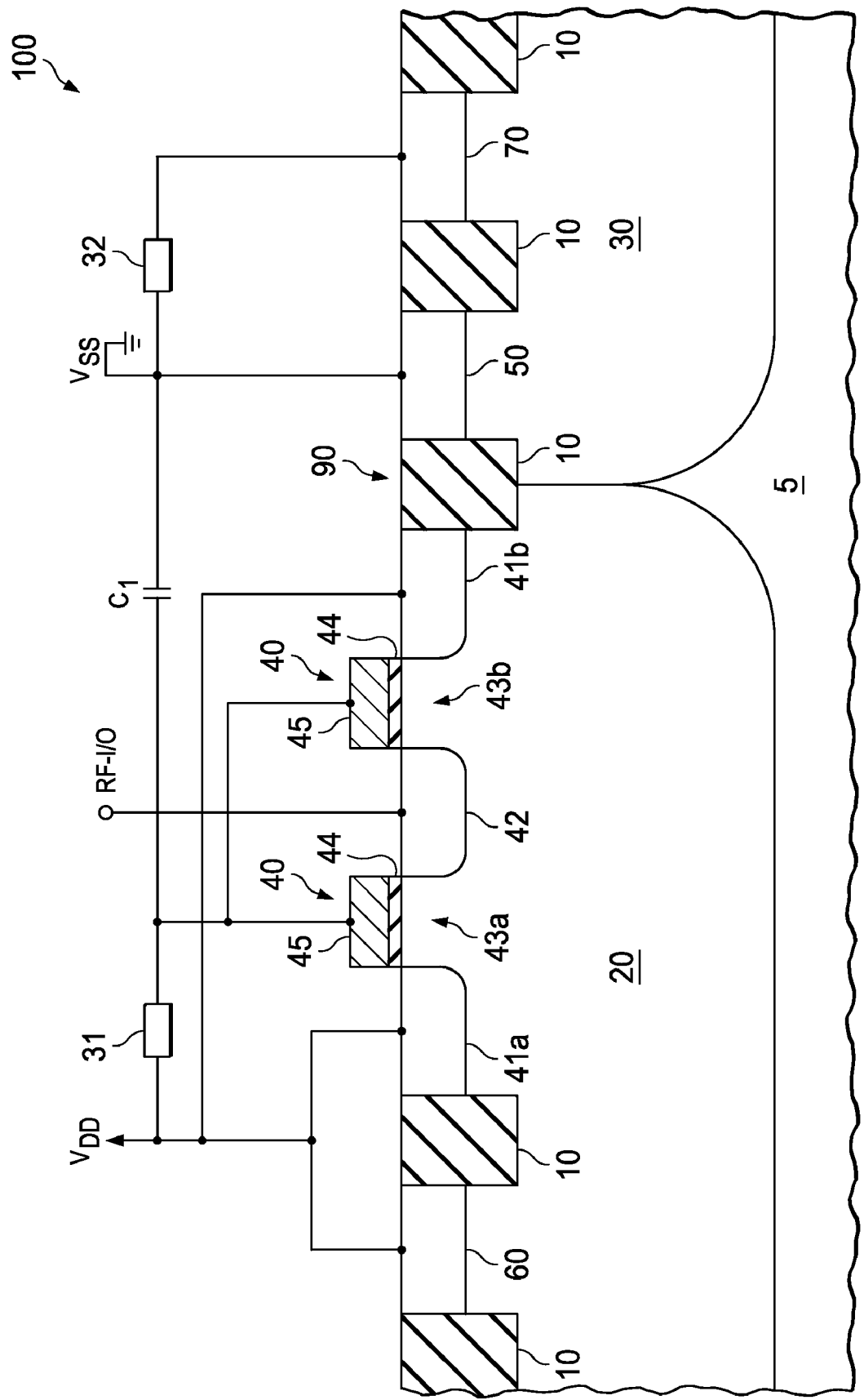
FIG. 4 is a cross sectional view of a double fingered transistor enhanced thyristor for positive ESD stress in accordance with an embodiment of the invention.

FIG. 4 illustrates an alternate embodiment of the first ESD device 100 described above. Unlike the first ESD device 100 described in FIG. 3, the embodiment illustrated in FIG. 4 includes a double finger structure forming the PMOS transistor 40. The double finger structure doubles the discharge current through PMOS transistor 40, while increasing the capacitance only minimally.

As illustrated in FIG. 4, the double fingered PMOS transistor 40 comprises a drain formed from the second doping region 42, and a first and a second source region 41a and 41b. Thus, a first channel region 43a and a second channel region 43b are formed in the first well region 20. Hence, two inversion regions are formed with two distinct current paths within the PMOS transistor 40. Besides this difference, the operation of the device is similar to the embodiment described in FIG. 3. In various embodiments, the PMOS transistor 40 can comprise any suitable structure such as multi finger structures.

Figure 5:
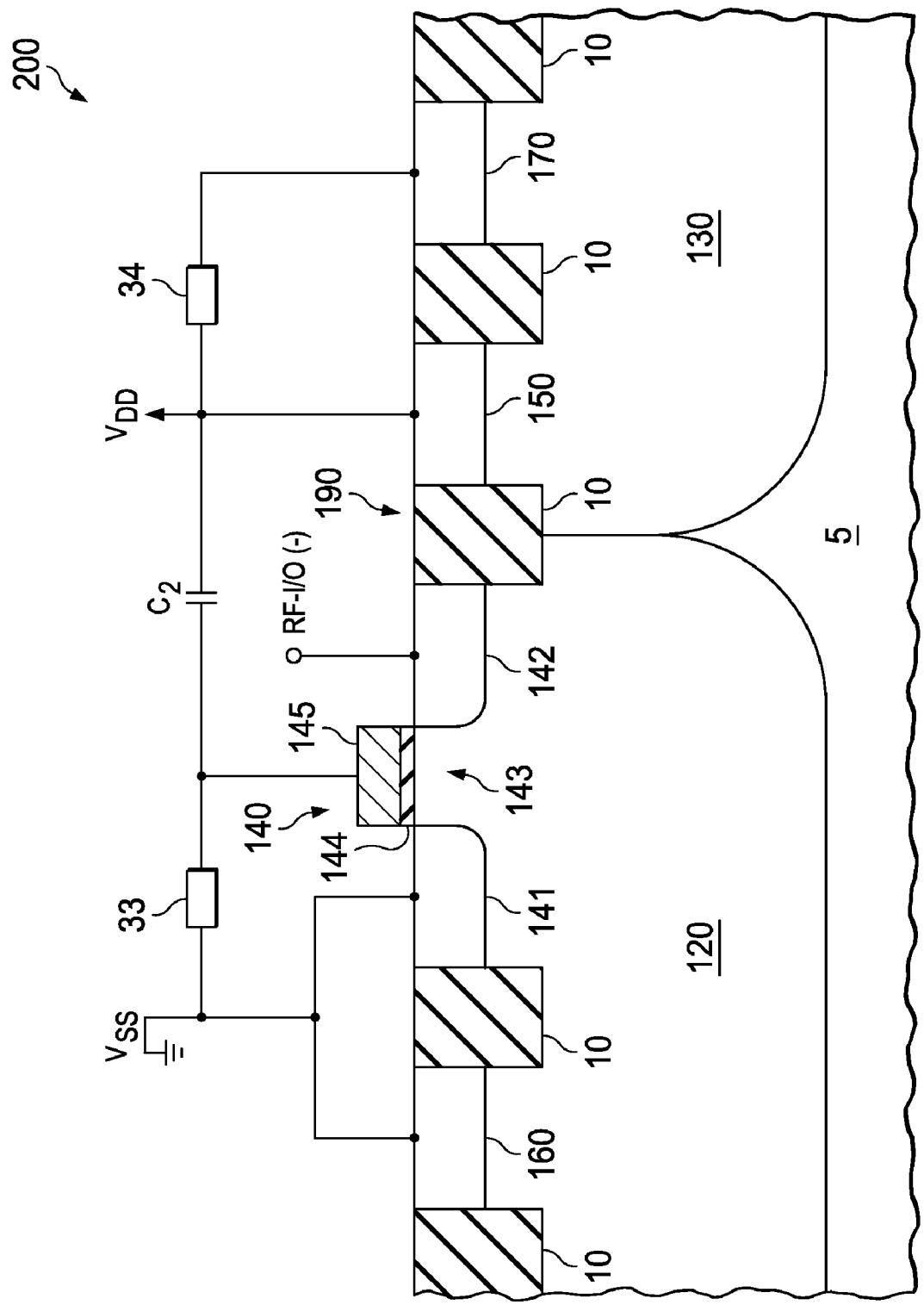
FIG. 5 is a cross sectional view of a transistor enhanced thyristor for negative ESD stress in accordance with an embodiment of the invention.

FIG. 5 illustrates an embodiment of the second ESD device 200 connected between the RF-I/O pads and $V_{DD}$. The second ESD device 200 provides a discharge path for negative stress on the RF-I/O pads.

As illustrated in FIG. 5, a NMOS transistor 140 and a NPNP thyristor 190 are disposed on the substrate 5. Isolation regions 10 are embedded in the substrate 5, and electrically isolate the doped regions.

A third well region 120 is disposed in the substrate 5 and comprises a low doped p-type region. A first n-type region 141 and a second n-type region 142 form the source/drain region of the NMOS transistor 140. In one embodiment, the first n-type region forms the source, and the second n-type region forms the drain of the transistor. The first and the second n-type regions 141 and 142, in one embodiment, comprise an $n^+$ doping. The first and the second n-type regions 141 and 142 may be doped with arsenic, phosphorus, antimony, or a combination thereof, wherein the total doping is greater than about $1 \times 10^{19}$ cm$^{-3}$, and is higher than about $1 \times 10^{20}$ cm$^{-3}$ in one embodiment. In various embodiments, the first and the second n-type regions 141 and 142 comprise a doping such that the Fermi level is within about 0.1 eV from the conduction band of the substrate 5. A p-type channel region 143 is disposed within the third well region 120.

A gate stack comprising a NMOS gate dielectric 144 and a NMOS gate electrode 145 are formed over the p-type channel region 143. The NMOS gate electrode 145 is a heavily doped n-type semiconductor region, and is degenerately doped in one embodiment. In other embodiments, the NMOS gate electrode 145 comprises a metal gate with a band edge work function, for example, less than at least 4.2 eV.

A fourth well region 130 is disposed adjacent the third well region 120. The fourth well region 130 comprises a low doped n-type region. A first p-type region 150 is formed on the fourth well region 130. The first p-type region 150 is heavily doped such that the Fermi level within the first p-type region 150 is within 0.1 eV from the valence band of the substrate 5. A second p-type region 160 and a third n-type region 170 form the contacts to the first and the second well regions 120 and 130, respectively. The second n-type region 142, the third well region 120, the fourth well region 130, and the first p-type region 150 form the NPNP thyristor 190. The NPNP thyristor 190 is hence formed from a layer sequence comprising $n^+/p/n/p^+$ layers.

As illustrated, the second doped region 142 forms both the drain of the NMOS transistor 140 and the anode of the NPNP thyristor 190. The drain of the NMOS transistor 140 and the cathode of the NPNP thyristor 190 are coupled to the RF-I/O pad, and hence subject to the ESD pulse. The source of the transistor 141 is further coupled to the third well region 120 through the second p-type region 160. Hence, the body and source of the NMOS transistor are tied together.

The gate electrode 145 is tied to the well contact and the source of the NMOS through a third resistor 33 and to the $V_{DD}$ node through a second capacitor $C_2$. The n-well contact of the NPNP thyristor 190 (third n-type region 170) is coupled to the anode of the NPNP thyristor 190 (first p-type region 150) through a fourth resistor 34 to minimize sensitivity to small variations in the gate signal.

On applying a negative stress on the source of the NMOS transistor 140 (second n-type region 142), a depletion region is formed under the NMOS gate dielectric 144 in the p-type channel region 143. After sufficient negative stress on the second n-type region 142, an inversion region is formed immediately underneath the gate dielectric 144, especially due to the second capacitor $C_2$ which ties the gate potential to $V_{DD}$. Hence, the NMOS transistor is turned on and creates a first fast discharge path for the ESD pulse. The discharge path is provided by the NMOS towards $V_{SS}$ when the $V_{SS}$ node is grounded. When the $V_{DD}$ node is grounded, the discharge path is provided by the NMOS and the serially connected power clamp. The discharge current (electron current) through the NMOS transistor 140 can be increased by increasing the saturation current, for example, by increasing the width or reducing the length of the transistor.

The ESD pulse forward biases the p-n junctions between the second n-type region 142 and the third well region 120, and the p-n junction between the fourth well region 130 and the first p-type region 150. However, the p-n junction between the third well region 120 and the fourth well region 130 is reverse biased.

The forward biased p-n junction between the second n-type region 142 and the third well region 120 or the second p-type region 160 creates a second discharge path to $V_{SS}$ when the $V_{SS}$ node is grounded. When the $V_{DD}$ node is grounded, a displacement current flows via the forward biased p-n junction (the second n-type region 142 via the third well region 120 to the second p-type region 160) to $V_{SS}$ and then through the buffer cap or power clamp from $V_{SS}$ to $V_{DD}$.

The displacement current flows during the rising edge of the pulse and leads to a triggering of the thyristor 190. The thyristor current flows from the second n-type region 142 to the first p-type region 150 through the first and the second well regions 120 and 130. In various embodiments, the NPNP thyristor 190 prevents the breakdown of the NMOS transistors as the ESD pulse voltage rises by providing a lower resistance discharge path.

In various embodiments, the method of fabricating the second ESD protection device 200 is similar to that explained with respect to FIG. 3 above. However, the doping type is reversed for all regions, and the coupling to the $V_{DD}$ and $V_{SS}$ nodes is reversed in view of the required circuit as illustrated in FIGS. 2 and 5.

Figure 6A:
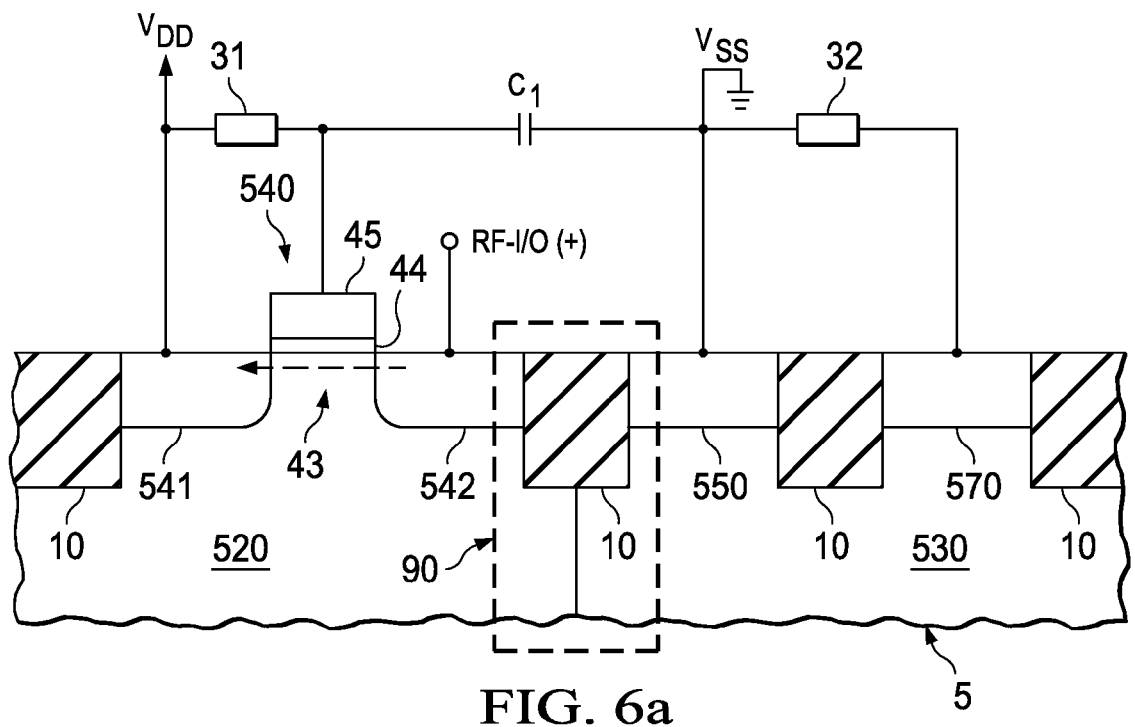
Figure 6B:
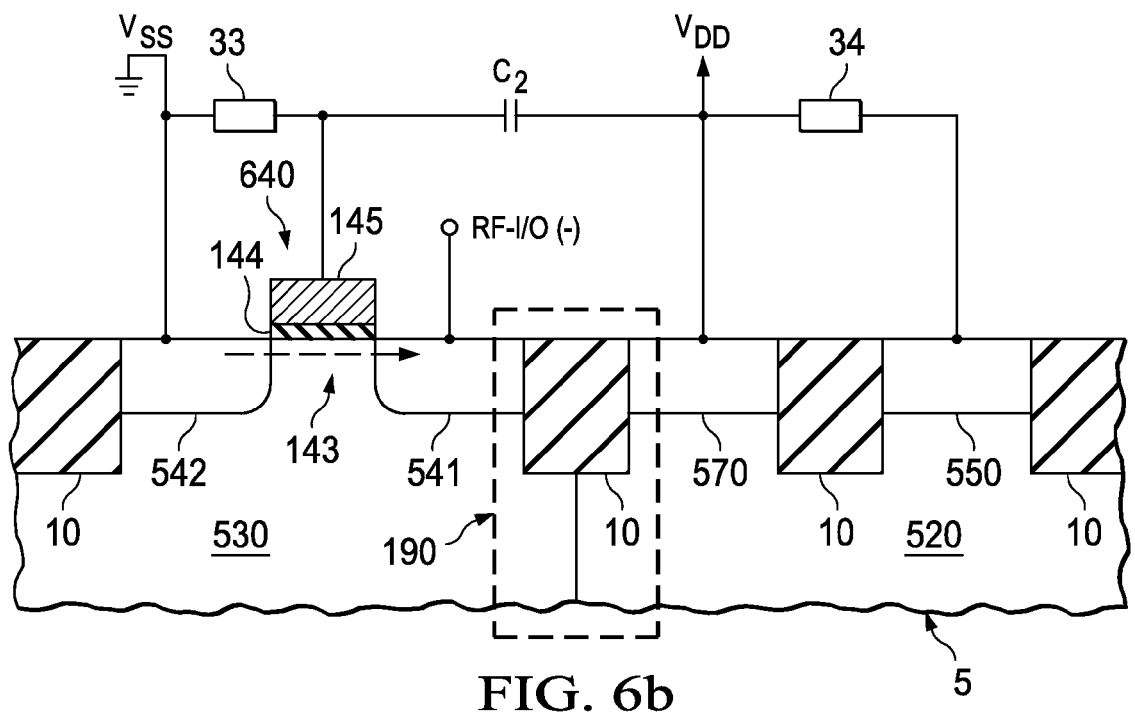

FIG. 6, which includes FIGS. 6a and 6b, illustrates a cross sectional view of an ESD protection device comprising a tunnel field effect transistor and a thyristor in an embodiment of the invention. The ESD protection device is illustrated as the first ESD device 100 in FIG. 2 and comprises a tunnel field effect transistor enhanced thyristor.

FIG. 6a is an alternative embodiment of FIG. 3. The PMOS transistor 40 of FIG. 3 is replaced by a tunnel PFET 540 with the heavily doped p+ region 542 (drain) coupled to the I/O node and the heavily doped n+ region 541 (source) coupled to the $V_{DD}$ node. The heavily doped p+ region 542 forms the drain of the tunnel PFET 540, while the heavily doped n+ region 541 forms the source of the tunnel PFET 540.

Referring to FIG. 6a, a tunnel PFET 540 and a PNPN thyristor 90 are disposed on the substrate. As in other embodiments, isolation regions 10 are embedded in the substrate, and electrically isolate the doped regions. An n-well region 520 is disposed in the substrate and comprises a low doped n-type region. The n-well region 520 is doped to a concentration of about $5\times10^{16}$ cm$^{-3}$ to about $5\times10^{18}$ cm$^{-3}$, and about $5\times10^{17}$ cm$^{-3}$, in one embodiment. A gate stack comprising a gate dielectric 44 and a gate electrode 45 are formed over the channel region 43.

Under inversion, a p+ channel is formed under the gate dielectric 44. Thus, a p+/n+ junction is formed at the edge of the source (heavily doped n+ region 541). The severe band bending at the p+/n+ junction, results in a flow of current (band to band tunnel current) forming a first fast discharge path. Being a tunneling current based device, the tunnel PFET 540 can be fabricated to have a faster turn-on characteristic (better sub threshold slope) than conventional MOS transistors. The first discharge current flows from the heavily doped p+ region 542 to the heavily doped n+ region 541 and into the $V_{DD}$ node. The second discharge path by transient triggered thyristor to $V_{SS}$ as described previously for example with respect to FIG. 3.

FIG. 6b is an alternative embodiment of FIG. 5. The NMOS transistor 140 is replaced by a tunnel NFET 640 with the n-drain coupled to the I/O node and the p-source coupled to $V_{SS}$. Referring to FIG. 6b, a tunnel NFET 640 and a NPNP thyristor 190 are disposed on the substrate. Isolation regions 10 are embedded in the substrate, and electrically isolate the doped regions. A gate stack comprising a gate dielectric layer 144 and a gate electrode layer 145 are formed over the p-type channel region 143. Under inversion, an n+ channel region is formed underneath the gate dielectric layer 144 and leads to an n+/p+ band to band tunnel current at the source edge. A first fast discharge path is thus formed by tunnel NFET 640 to $V_{SS}$. The second discharge path by transient triggered thyristor to $V_{DD}$ as described previously for example with respect to FIG. 5.

Figure 7A:
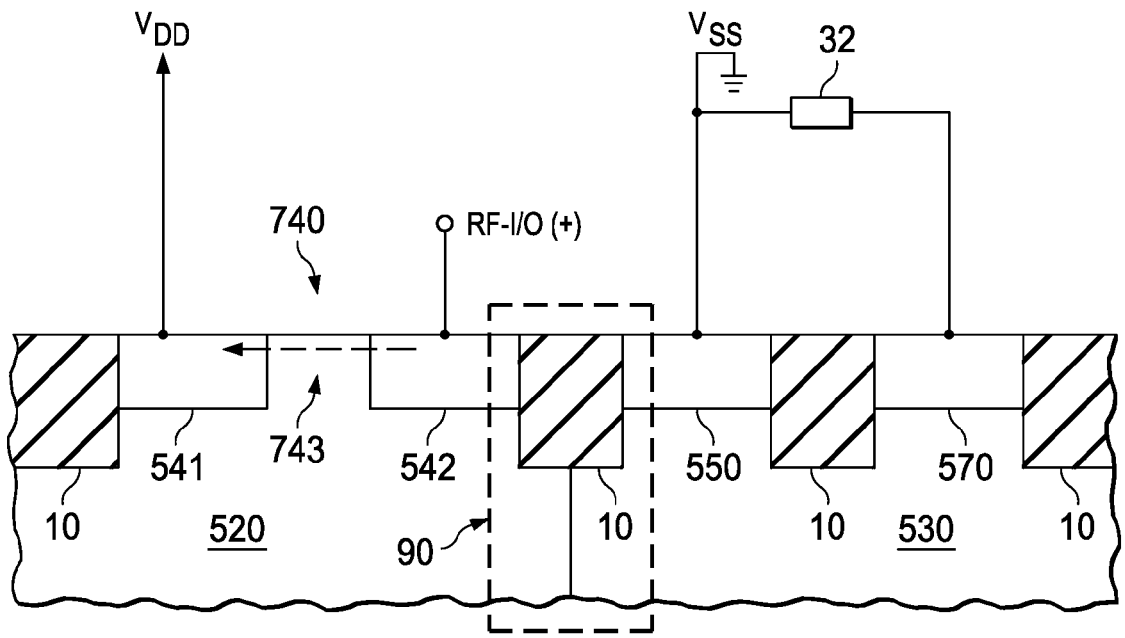
FIGS. 7a and 7b, is a cross sectional view of a pin diode enhanced thyristor for a positive ESD stress (FIG. 7a) and for a negative ESD stress (FIG. 7b), in accordance with an embodiment of the invention.
Figure 7B:
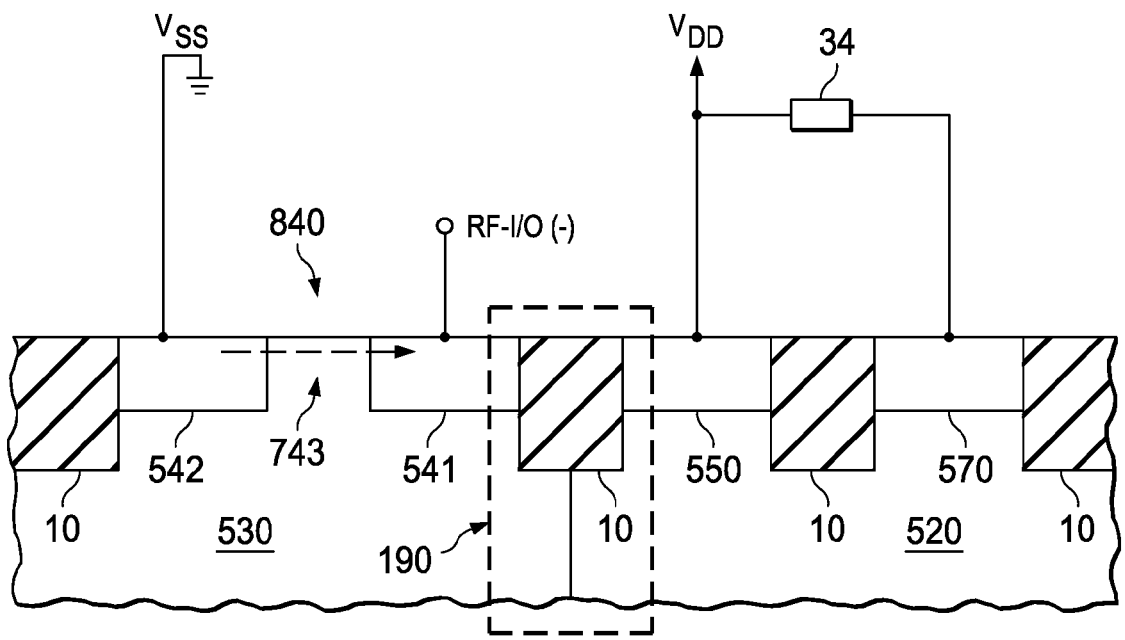

FIG. 7, which includes FIGS. 7a and 7b, illustrates a cross sectional view of an ESD protection device comprising a PIN diode and a thyristor in an embodiment of the invention. The ESD protection device is illustrated as the first ESD device 100 in FIG. 2 and comprises a pin diode enhanced thyristor.

FIG. 7a is an alternative embodiment of FIG. 6a. In this embodiment, the tunnel PFET 540 is replaced by a PIN diode 740 comprising p-type/intrinsic/n-type regions with its p-anode (heavily doped p+ region 542) coupled to the I/O node and its n-cathode (heavily doped n+ region 541) coupled to the $V_{DD}$ node. The intrinsic zone 743 is formed in the n-well region 520 by special mask steps blocking both the p+ and the n+ implantation. Alternatively, a gate electrode or gate line can also be used to block p+ and n+ implantation in a self aligned process sequence. The fast first discharge to $V_{DD}$ is provided by the pin-like diode, while the second discharge path to the $V_{SS}$ node is provided by the transient triggered PNPN thyristor 90 as described previously, for example in FIG. 3.

FIG. 7b is an alternative embodiment of FIG. 6b. In this embodiment, the tunnel NFET transistor 640 is replaced by a NIP diode 840 comprising n-type/intrinsic/p-type regions with its n-cathode (heavily doped n+ region 541) coupled to the I/O node and its p-anode (heavily doped p+ region 542) coupled to the $V_{SS}$ node. The intrinsic zone 743 is formed in the p-well region 530 by special mask steps blocking both the p+ and the n+ implantation. Alternatively, a poly gate can also be used to block p+ and n+ implantation in a self aligned process sequence. The first fast discharge to $V_{SS}$ node is provided by the NIP diode 840, while the second discharge path to $V_{DD}$ is provided by the transient triggered NPNP thyristor 190 as described previously with respect to FIG. 5.

Figure 8A:
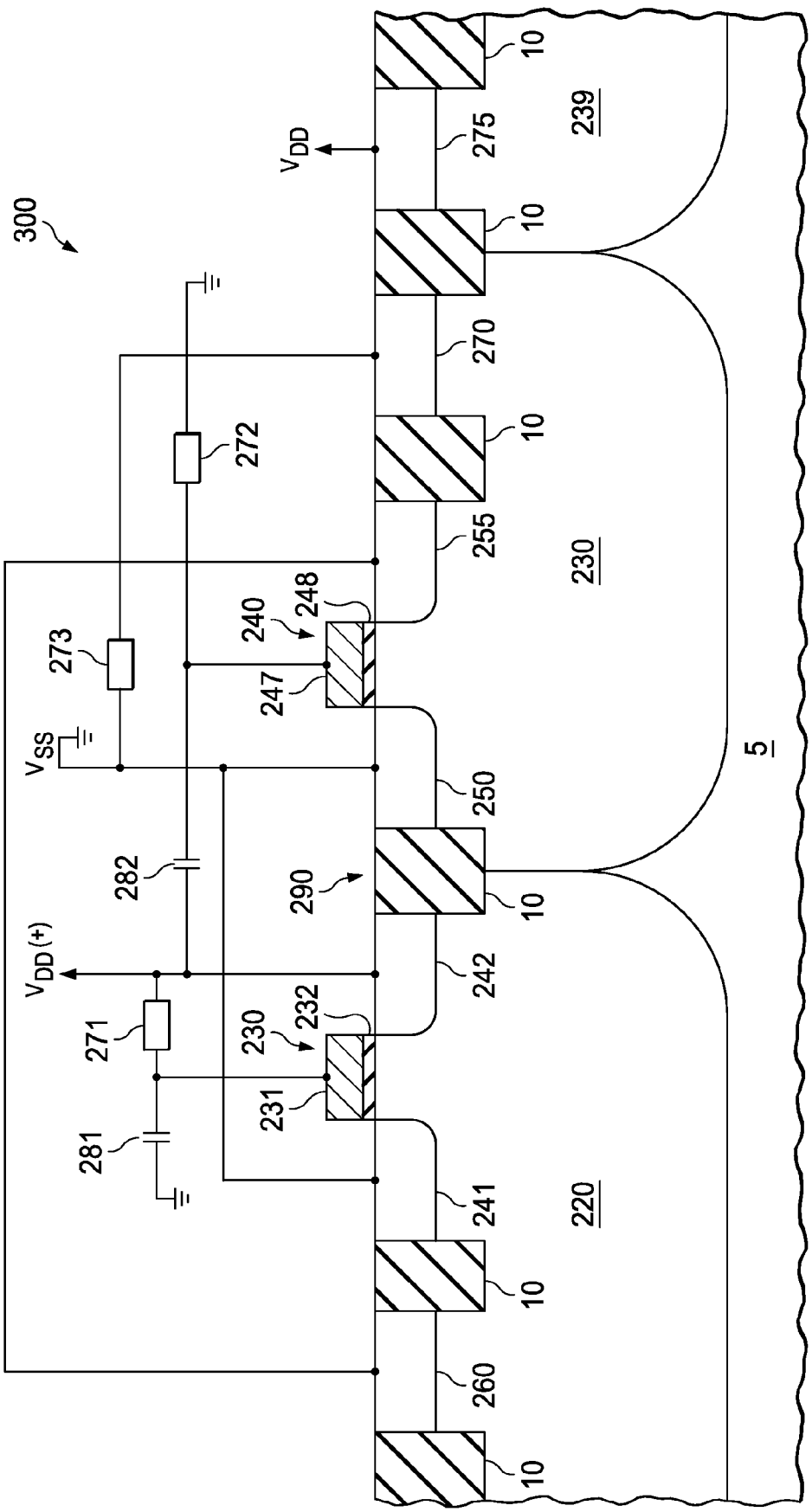
FIGS. 8a and 8b, illustrates a power clamp transistor enhanced thyristor for positive ESD stress, utilizing a p-channel MOS transistor as fast discharge path and an n-channel MOS transistor as fast thyristor trigger path.
Figure 8B:
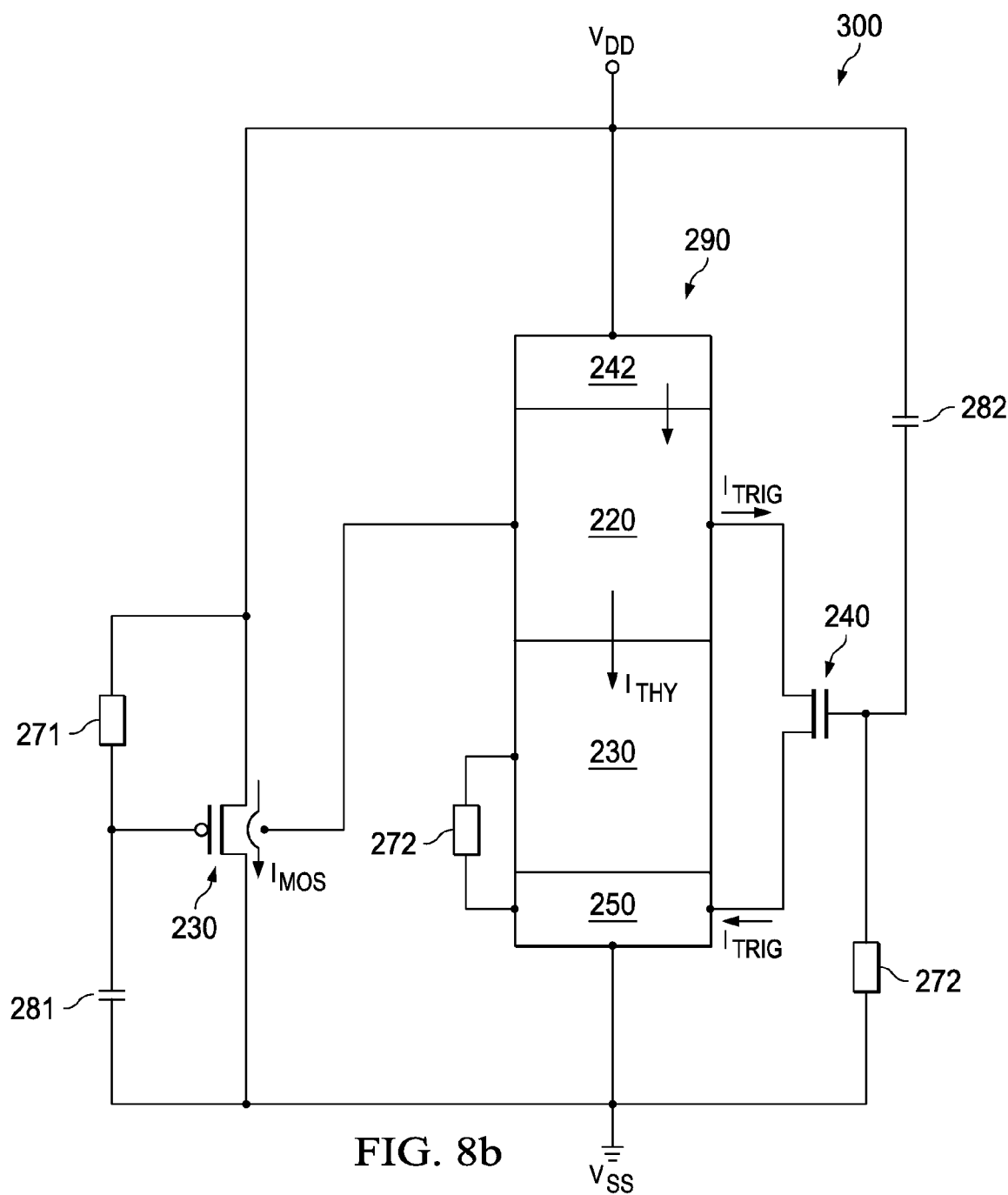

FIG. 8, which includes FIGS. 8a and 8b, illustrates an embodiment of an ESD power clamp device in accordance with embodiments of the invention. The third ESD device 300 is connected between the $V_{DD}$ and $V_{SS}$ nodes.

Referring to FIG. 8a, a first and a second heavily doped region 241 and 242 form drain/source regions of a first transistor 230. The first and the second heavily doped regions are disposed on a first low doped well region 220. A first gate electrode 231 is disposed above the first low doped well region 220 and between the first and the second heavily doped regions 241 and 242. A first gate dielectric 232 is disposed under the first gate electrode 231.

The source/drain regions of the second transistor 240 are formed from third and fourth heavily doped regions 250 and 255. The third and fourth heavily doped regions are disposed on a second low doped region 230. A second gate electrode 247 is disposed above the second low doped region 230 and between the third and the fourth heavily doped regions 250 and 255. A second gate dielectric 248 is disposed under the second gate electrode 247.

A transistor enhanced thyristor 290 is formed comprising the second heavily doped region 242, the first low doped region 220, the second low doped region 230, and the third heavily doped region 250. A fifth and a sixth heavily doped region 260 and 270 form the contacts to the low doped well regions 220 and 230, respectively. A seventh heavily doped region may be disposed in a third low doped region 239 shielding the second low doped region 230 to optimize the trigger behavior of the thyristor.

The first, the second, and the sixth heavily doped regions 241, 242, and 270 comprise p-type doping. In one embodiment, the first, the second, and the sixth heavily doped regions 241, 242, and 270 may be doped with boron and comprise doping concentrations greater than about $1 \times 10^{19}$ cm$^{-3}$, and higher than about $1 \times 10^{20}$ cm$^{-3}$ in one embodiment. In various embodiments, the heavy doping comprises a doping such that the Fermi level is within about 0.1 eV from the conduction or valence band of the substrate 5.

The third, the fourth, the fifth, and the seventh heavily doped regions 250, 255, 260, and 275, respectively comprise n-type doping. In various embodiments, the third, the fourth, the fifth, and the seventh heavily doped regions 250, 255, 260, and 275, respectively, may be doped with phosphorus, arsenic, antimony, or a combination thereof. Again the third, the fourth, the fifth, and the seventh heavily doped regions 250, 255, 260, and 275, respectively, are doped with doping concentrations greater than about $1 \times 10^{19}$ cm$^{-3}$, and higher than about $1 \times 10^{20}$ cm$^{-3}$ in one embodiment.

The first and third low doped regions 220 and 239 comprise n-type doping whereas the second low doped region 230 comprises a p-type doping. The first, the second, and the third low doped regions 220, 230, and 239, respectively, are doped to a concentration of about $5 \times 10^{16}$ cm$^{-3}$ to about $5 \times 10^{18}$ cm$^{-3}$, and about $5 \times 10^{17}$ cm$^{-3}$ in one embodiment.

Thus the first transistor 230 comprises a p-channel transistor, and the second transistor 240 comprises an n-channel transistor, and the thyristor 290 comprises a PNPN thyristor formed from a p$^+$/n/p/n$^+$.

The first transistor 230 and the thyristor 290 are connected in parallel between the $V_{DD}$ and the $V_{SS}$ nodes. Hence, the source contact of the first transistor 230 and the anode terminal of the thyristor 290 coupled to the $V_{DD}$ node, while the drain contact of the first transistor 230 and the cathode terminal of the thyristor are coupled to $V_{SS}$ node. Referring to FIG. 8a, the second heavily doped region 242 (source contact of the first transistor 230 and the anode terminal of the thyristor) is coupled to the $V_{DD}$ node. The drain of the first transistor (first heavily doped region 241) is coupled to the cathode terminal of the thyristor 290 (third heavily doped region 250). The first gate electrode 231 is coupled to the $V_{DD}$ node through a first resistor 271 and coupled to the $V_{SS}$ node through a first capacitor 281.

The drain contact (fourth heavily doped region 255) of the second transistor 240 is coupled to the fifth heavily doped region 260 of the thyristor 290 through the first low doped region 220. The source contact (third heavily doped region 250) of the second transistor 240 is coupled to the drain contact (first heavily doped region 241) of the first transistor 230.

The gate electrode 247 is capacitively coupled to the $V_{DD}$ node via second capacitor 282 and to $V_{SS}$ via a second resistor 272. The cathode terminal of the thyristor (third heavily doping region 250) is coupled to the second low doped region 230 of the thyristor (via sixth heavily doped region 270) through a third resistor 273.

The operation of the transistor enhanced thyristor of FIG. 8a is described using FIG. 8b. On applying a positive ESD stress from $V_{DD}$ to $V_{SS}$ the source node (heavily doped region 242) of the PMOS transistor 230 is positively biased while the first capacitor 281 ties the gate potential to ground. Thus, a depletion region is formed under the first gate dielectric 231 in the first low doped region 220. After sufficient positive stress at the source node (heavily doped region 242), an inversion region is formed immediately underneath the first gate dielectric 231. Hence, the PMOS transistor turns on and conducts a current $I_{MOS}$ creating a first fast discharge path for the ESD pulse from $V_{DD}$ to $V_{SS}$.

Unlike the prior embodiments where the transistor enhanced thyristor is used at the I/O node, no thyristor trigger path is available between $V_{DD}$ and $V_{SS}$. Hence, an additional trigger device 240 is included. In various embodiments, the trigger device 240 comprises a MOS transistor. The trigger current ($I_{TRIG}$) flowing through the trigger MOS transistor triggers a current flow $I_{THY}$ in the thyristor 290 which creates a second discharge path through the thyristor. Due to the second capacitor 282 connected between $V_{DD}$ and the second gate electrode 247 of the NMOS, the trigger device 240 causes a trigger current $I_{TRIG}$ to flow whenever the voltage at the $V_{DD}$ node exceeds a certain threshold. The second discharge path provided by the thyristor addresses pulses with a duration much greater than 1 ns (>>1 ns) and also protects the PMOS from breakdown in this time regime.

Referring to FIG. 8b, the transistor enhanced thyristor includes a bipolar junction transistor (BJT) PNP device, and a BJT NPN device. The BJT PNP device is made up of the second p-type region 242 as the emitter, the first low doped region 220 as the base, and the second low doped region 230 as the collector. The BJT NPN device is made up of first low doped region 220 as the collector, the second low doped region 230 as the base, and the third heavily doped region 250 as the emitter. When trigger current $I_{TRIG}$ flows from the base of the BJT PNP device in response to a voltage transient at the $V_{DD}$ node, the collector of the BJT PNP device is pulled high, which turns on the BJT NPN device, thereby latching the bipolar junction transistors and causing a large current $I_{THY}$ to flow through the transistor enhanced thyristor 290.

Figure 9A:
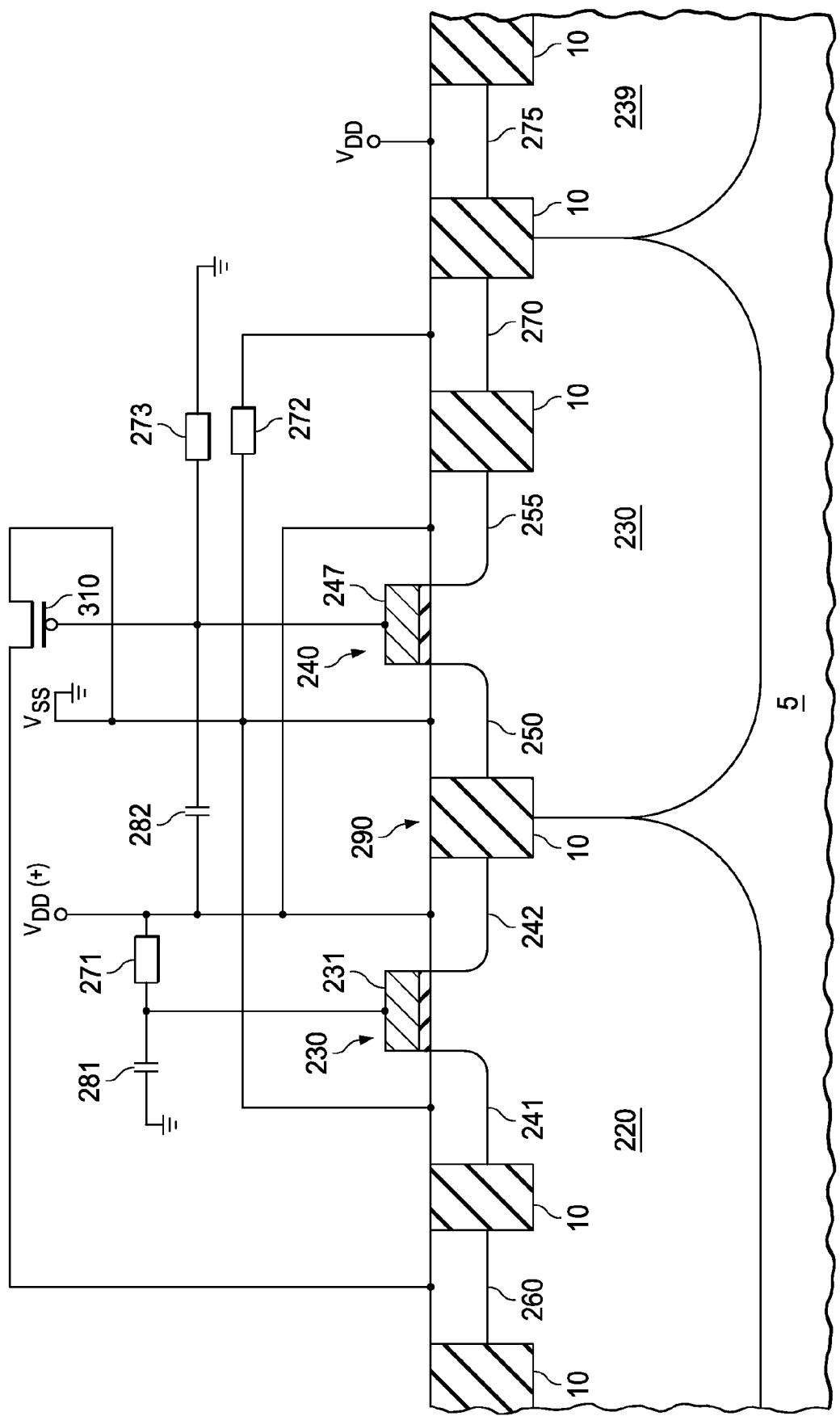
Figure 9B:
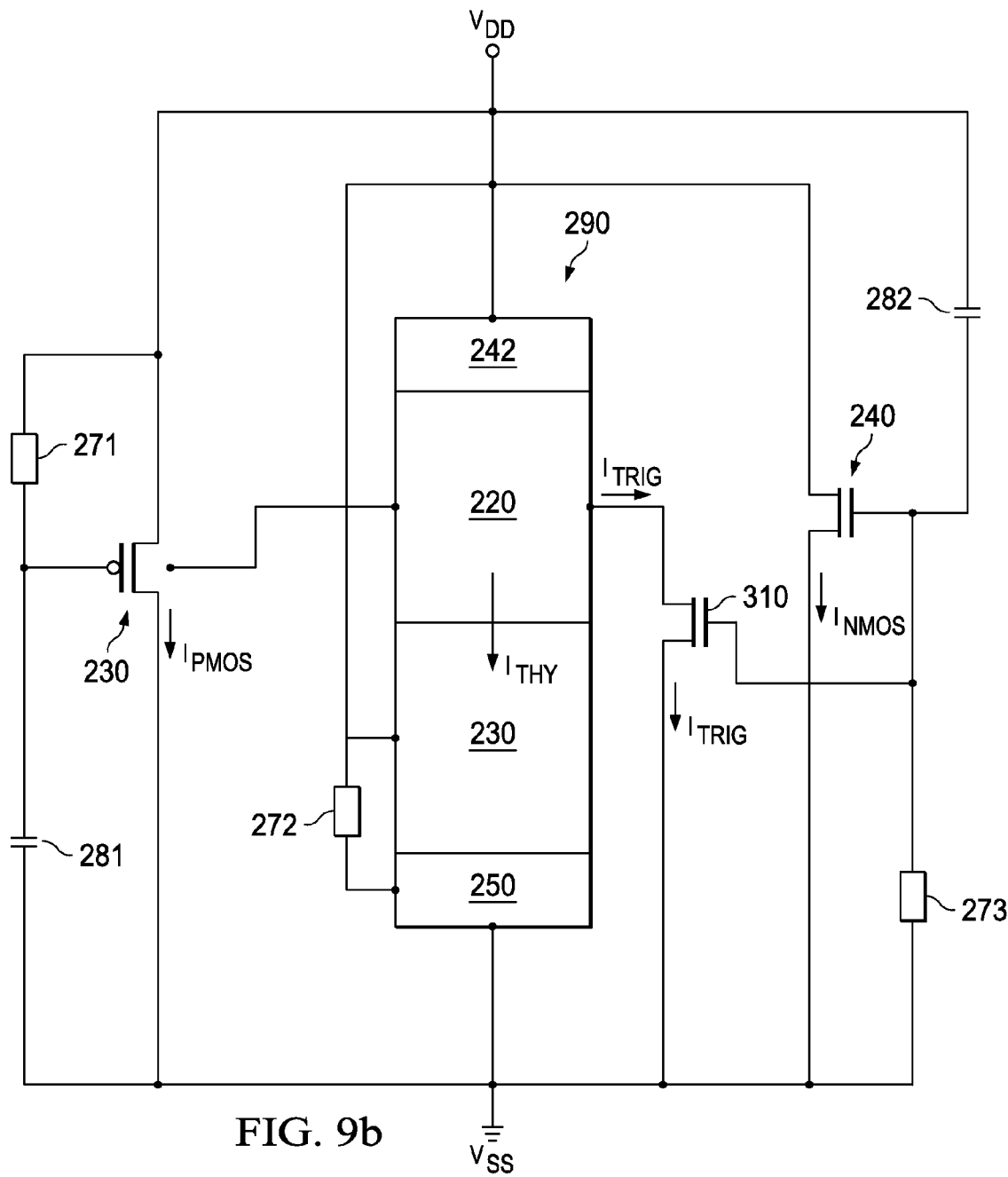
Figure 9C:
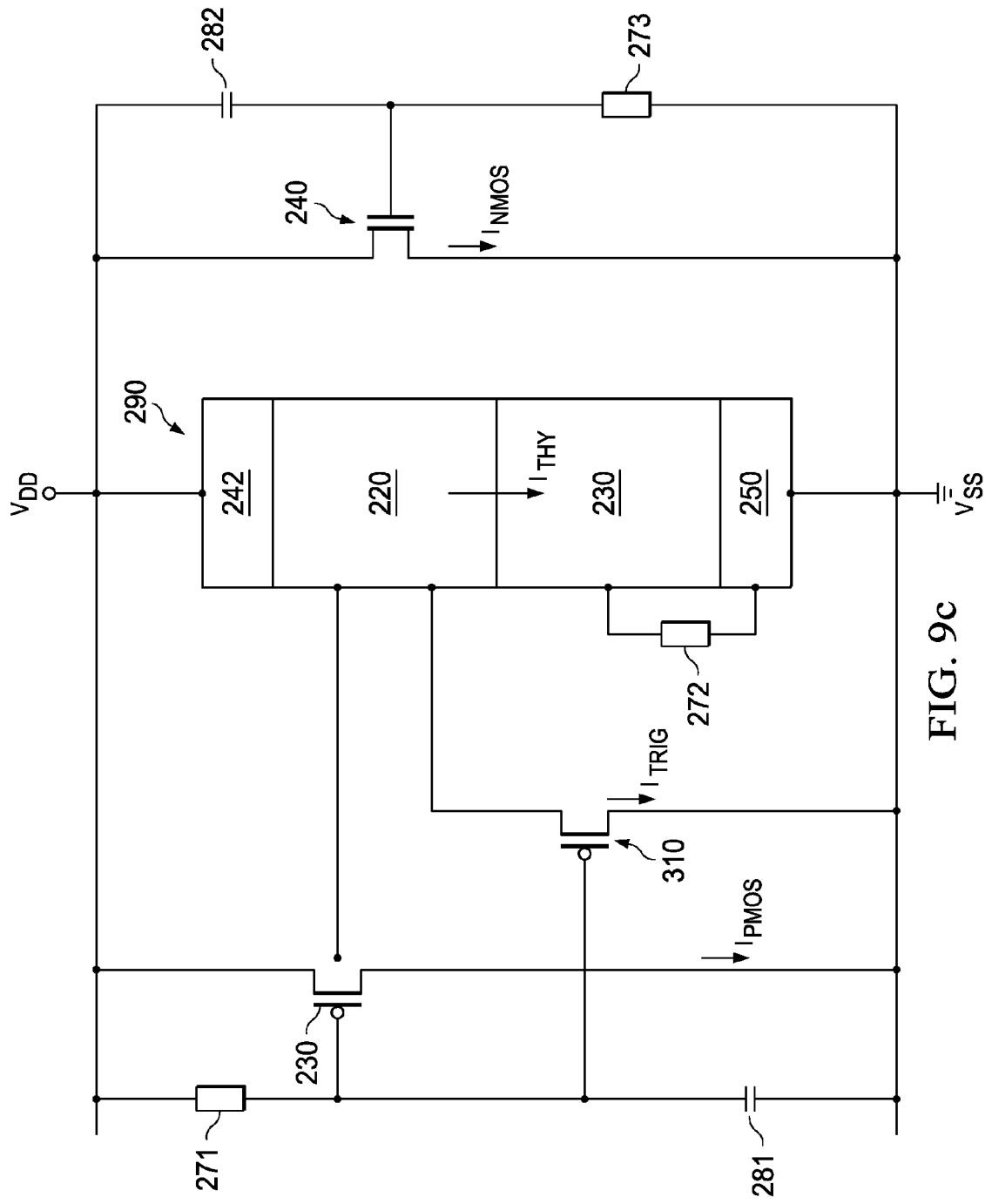

FIG. 9, which includes FIGS. 9a-9c, illustrates an embodiment of an ESD power clamp device in accordance with embodiments of the invention. As illustrated in FIG. 2, the third ESD device 300 when used as a power clamp device is connected between the $V_{DD}$ and $V_{SS}$ nodes.

Unlike the embodiment described in FIG. 8, in this embodiment, an external transistor is used as a trigger device. Further, both the discharge path includes both a NMOS and a PMOS transistor. Both the NMOS and the PMOS transistors are designed to be in parallel with the transistor enhanced thyristor 290 and provide alternate discharge paths.

Referring to FIG. 9a, the first, the second, the third, the fourth, the fifth, the sixth, and the seventh heavily doped regions 241, 242, 250, 255, 260, 270, and 275, respectively, are similar as described with respect to FIG. 8. Similarly, the first, the second, and the third low doped regions 220, 230, and 240, respectively, are disposed in the substrate 5 as described in FIG. 8.

The PMOS gate electrode 231 and the NMOS gate electrode 247 are formed over the first low doped region 220 and the second low doped region 230 respectively forming a PMOS transistor 230 and an NMOS transistor 240. The transistor enhanced thyristor 290 is formed between the second heavily doped region 242 and the third heavily doped region 250.

Unlike the prior embodiment described in FIG. 8, an external transistor 310 forms the trigger device. In FIG. 9b, the external transistor 310 comprises a NMOS transistor. Referring to FIG. 9b, the PMOS and the NMOS transistors 230 and 240 form discharge transistors during the ESD pulse. The PMOS and the NMOS transistors 230 and 240 are designed so as to turn-on rapidly with a few tens of pico seconds. During the initial portion of the ESD pulse, the PMOS and the NMOS transistors discharge the ESD pulse as source to drain currents $I_{PMOS}$ and $I_{NMOS}$ respectively.

In another embodiment as illustrated in FIG. 9c, the external transistor 310 comprises a PMOS transistor. In this embodiment, the external transistor 310 is coupled to the PMOS gate electrode 231.

Subsequently, the external transistor 310 turns-on and carriers a trigger current $I_{TRIG}$ from the base of the PNP device of the transistor enhanced thyristor 290, which triggers the thyristor. The remaining portion of the ESD pulse is thus discharged (as thyristor current $I_{THY}$) through the lower resistance path provided by the transistor enhanced thyristor 290.

Figure 10A:
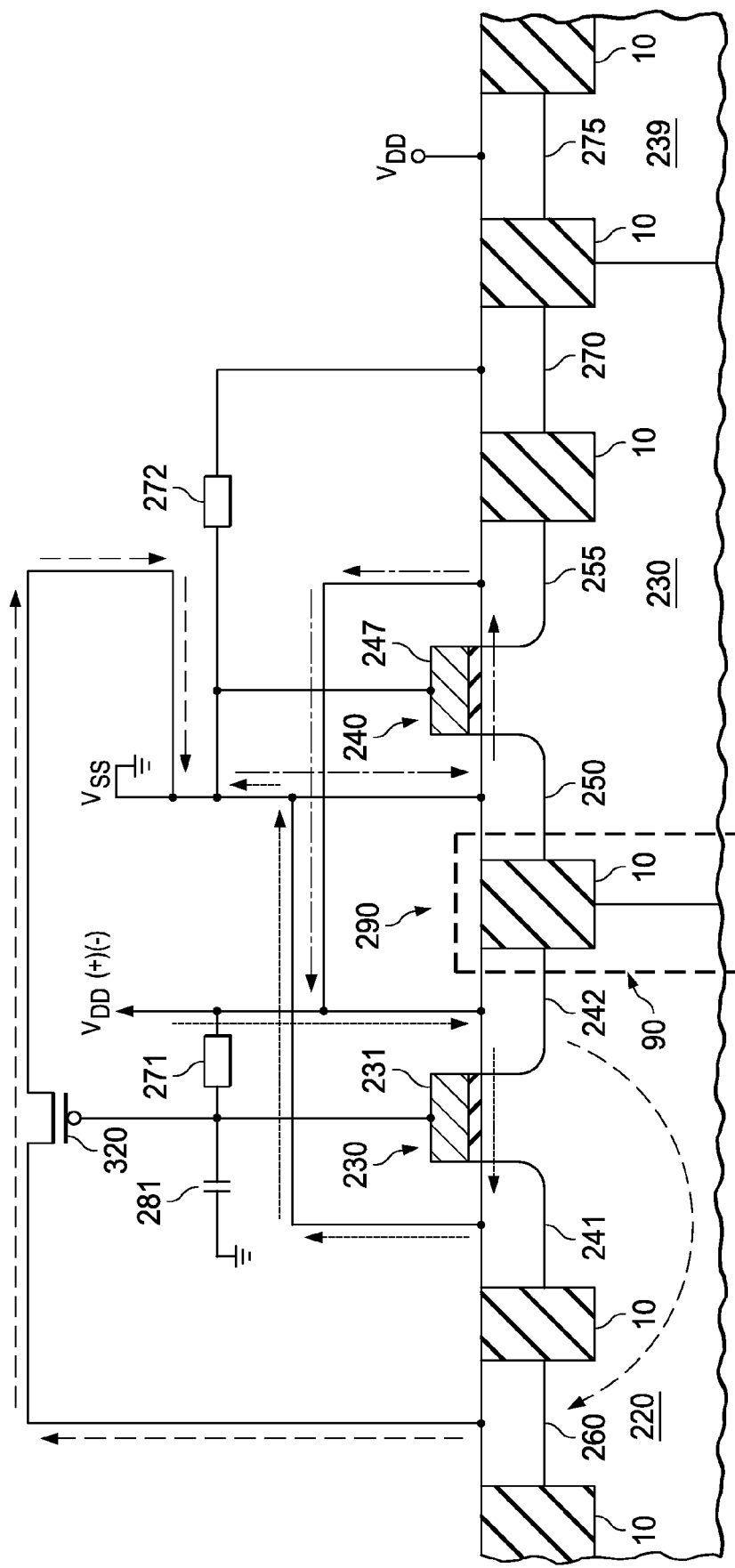
Figure 10B:
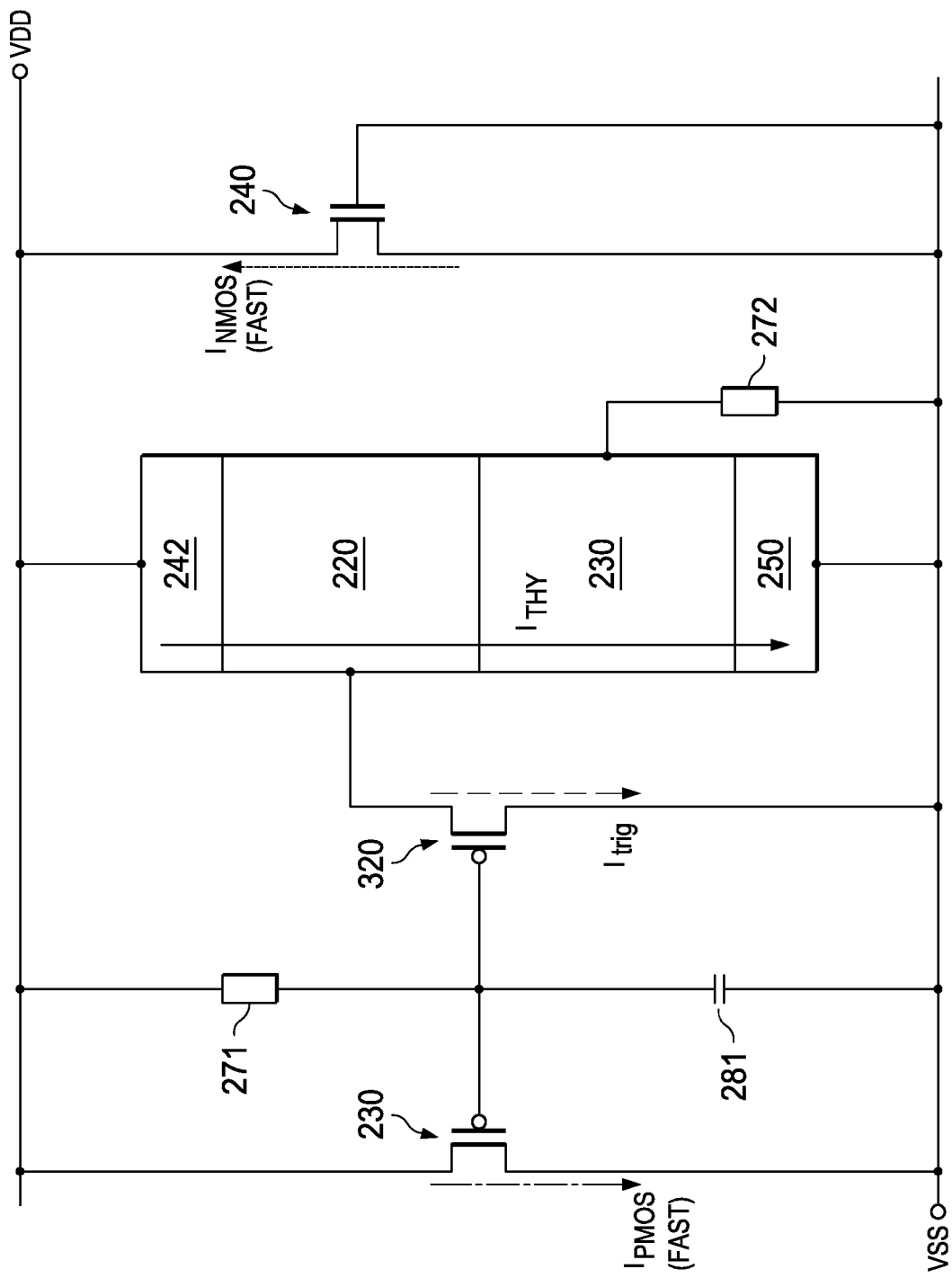

FIG. 10, which includes FIGS. 10a and 10b, illustrates an embodiment of an ESD power clamp device for use as the third ESD device 300 of FIG. 2, in accordance with embodiments of the invention. Unlike the embodiment described in FIGS. 8 and 9 which require an external reverse diode for negative stress from $V_{DD}$ to $V_{SS}$, in this embodiment, the internal NMOS transistor is used as a fast discharge device for this stress mode. In this stress configuration the NMOS is operated as MOS diode by coupling both the source and gate nodes to $V_{SS}$ node.

Referring to FIG. 10a, the first, the second, the third, the fourth, the fifth, the sixth, and the seventh heavily doped regions 241, 242, 250, 255, 260, 270, and 275, respectively, are similar as described with respect to FIG. 8. Similarly, the first, the second, and the third low doped regions 220, 230, and 240, respectively, are disposed in the substrate as described in FIG. 8. The PMOS gate electrode 231 and the NMOS gate electrode 247 are formed over the first low doped region 220 and the second low doped region 230 respectively forming a PMOS transistor 230 and an NMOS transistor 240. The transistor enhanced thyristor 290 is formed between the second heavily doped region 242 and the third heavily doped region 250. As in FIG. 9 and unlike the prior embodiment described in FIG. 8, an external PMOS transistor 320 forms the trigger device. In this example, the external PMOS transistor 320 is a PMOS transistor.

Referring to FIG. 10b, the PMOS 230 forms the first fast discharge path during a positive ESD pulse on the $V_{DD}$ node, whereas the NMOS transistors 240 form discharge transistors during a negative ESD pulse on the $V_{DD}$ node, while the $V_{SS}$ node is grounded in both cases. The PMOS and the NMOS transistors 230 and 240 are designed so as to turn-on rapidly within a few tens of pico seconds. Unlike the embodiment of FIG. 9, the NMOS transistor 240 has its gate electrode and source nodes tied together. During the initial portion of the ESD pulse, either the PMOS or the NMOS transistors discharge the ESD pulse as first fast discharge currents $I_{PMOS}$ (fast) (dotted lines in FIGS. 10a and 10b) or $I_{NMOS}$ (fast) (small dashed lines in FIGS. 10a and 10b) respectively depending on the polarity of the ESD pulse.

Subsequently, the external PMOS transistor 320 turns-on and carriers a trigger current $I_{TRIG}$ (long dashed lines in FIGS. 10a and 10b) from the base of the PNP device of the transistor enhanced thyristor 290, which triggers the thyristor. The remaining portion of the ESD pulse is thus discharged (as thyristor current $I_{THY}$) through the lower resistance path provided by the transistor enhanced thyristor 290

The present invention, in various embodiments have been described for protecting sensitive circuitry in a RF-I/O circuit, although in other embodiments, the ESD protection devices described herein may be used for other types of circuits.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include

What is claimed is:

1. A semiconductor device comprising:
  a first doped region disposed in a substrate;
  a first source/drain region disposed in the first doped region, the first source/drain region comprising a first conductivity type, and the first doped region comprising a second conductivity type, the first and the second conductivity types being opposite, the first source/drain region being coupled to a node to be protected;
  a second source/drain region coupled to a first power supply potential node, the second source/drain region being coupled to the first doped region;
  a gate electrode coupled to the first power supply potential node via a trigger circuit, wherein the first and the second source/drain regions, the first doped region, and the gate electrode form a transistor;
  a second doped region disposed adjacent the first doped region, the second doped region comprising the first conductivity type; and
  a terminal region disposed in the second doped region, the terminal region comprising the second conductivity type and being coupled to a second power supply potential node, wherein the first source/drain region, the first doped region, the second doped region and the terminal region form a thyristor, wherein the transistor provides a first discharge path for an electro static discharge pulse on an input/output pad of a semiconductor chip, wherein the thyristor provides a second discharge path for an electro static discharge pulse on an input/output pad of a semiconductor chip, and wherein the first discharge path is formed before the second discharge path.

2. The device of claim 1, further comprising an isolation region disposed between the terminal region and the first source/drain region.

3. The device of claim 1, further comprising a resistor between the terminal region and the second doped region.

4. The device of claim 1, further comprising a second resistor between the gate electrode and the first power supply potential node.

5. The device of claim 1, further comprising a capacitor coupled between the gate electrode and the second power supply potential node.

6. The device of claim 1, wherein the first conductivity type comprises a p-type region, wherein the second conductivity type comprises an n-type region.

7. The device of claim 6, wherein the node to be protected comprises a positive potential node during an electro static discharge.

8. The device of claim 7, wherein the first power supply potential node comprises a $V_{DD}$ potential node, and wherein the second power supply potential node comprises a $V_{SS}$ potential node.

9. The device of claim 1, wherein the first conductivity type comprises an n-type region, wherein the second conductivity type comprises a p-type region.

10. The device of claim 9, wherein the node to be protected comprises a negative potential node during an electro static discharge.

11. The device of claim 10, wherein the first power supply potential node comprises a $V_{SS}$ potential node, and wherein the second power supply potential node comprises a $V_{DD}$ potential node.

12. The device of claim 1, further comprising a third source/drain region disposed on the first doped region, the third source/drain region being coupled to the first source/drain region, wherein the second source/drain region is disposed between the first source/drain region and the third source/drain region.

13. The device of claim 12, wherein the first conductivity type comprises an n-type region, wherein the second conductivity type comprises a p-type region, and wherein the node to be protected comprises a negative potential node during an electro static discharge.

14. The device of claim 1, wherein the first and the second power supply voltage nodes power active circuitry on the semiconductor chip.

15. The device of claim 1, wherein the first source/drain region comprises a source region, and wherein the second source/drain region comprises a drain region.

16. A semiconductor device comprising:
  a transistor coupled to a node to be protected and to a first power supply potential node, wherein the transistor turns on after a first time upon being subjected to an ESD current pulse, wherein the transistor discharges at least a portion of the current pulse by a flow of a first discharge current from the node to be protected to the first power supply potential node; and
  a thyristor coupled to the node to be protected and to a second power supply potential node, wherein the thyristor is triggered into a low resistance mode after a second time upon being subjected to the current pulse, wherein the first time is less than the second time, and wherein the thyristor discharges the current pulse by a flow of a second discharge current from the node to be protected to the second power supply potential node, wherein the first time is about 10 pico seconds to about 200 pico seconds, and wherein the second time is about 100 pico seconds to about 500 pico seconds.

17. The device of claim 16, wherein the transistor comprises a tunnel transistor.

18. The device of claim 16, wherein the transistor comprises a PMOS or a NMOS transistor.

19. The device of claim 16, wherein the transistor is a NMOSFET, wherein the thyristor is a NPNP thyristor, wherein the first power supply potential node is a $V_{SS}$ node, wherein the second power supply potential node is a $V_{DD}$ node, and wherein the node to be protected is an RF input/output terminal exposed to a negative ESD current.

20. The device of claim 16, wherein the transistor is a PMOSFET, wherein the thyristor is a PNPN thyristor, wherein the first power supply potential node is a $V_{DD}$ node, wherein the second power supply potential node is a $V_{SS}$ node, and wherein the node to be protected is an RF input/output terminal exposed to a positive ESD current.

21. A semiconductor device comprising:
  a first low doped region disposed in a substrate;
  a first heavily doped region disposed within the first low doped region, the first heavily doped region comprising a first conductivity type, and the first low doped region comprising a second conductivity type, the first and the second conductivity types being opposite, the first heavily doped region being coupled to a node to be protected;
  a second heavily doped region coupled to a first power supply potential node, the second heavily doped region being separated from the first heavily doped region by a portion of the first low doped region;
  a second low doped region disposed adjacent the first low doped region, the second low doped region comprising the first conductivity type, wherein the first low doped region contacts the second low doped region forming a p/n junction; and a third heavily doped region disposed in the second low doped region, the third heavily doped region comprising the second conductivity type and being coupled to a second power supply potential node.

22. The device of claim 21, wherein the first heavily doped region, the first low doped region, the second low doped region and the third heavily doped region form a thyristor.

23. The device of claim 21, further comprising an isolation region disposed between the third heavily doped region and the first heavily doped region.

24. The device of claim 21, further comprising a first resistor between the third heavily doped region and the second low doped region.

25. The device of claim 24, wherein the second heavily doped region is coupled to the first low doped region.

26. A semiconductor device, comprising:
a first low doped region disposed in a substrate;
a first heavily doped region disposed within the first low doped region, the first heavily doped region comprising a first conductivity type, and the first low doped region comprising a second conductivity type, the first and the second conductivity types being opposite, the first heavily doped region being coupled to a node to be protected;
a second heavily doped region coupled to a first power supply potential node, the second heavily doped region being separated from the first heavily doped region by a portion of the first low doped region, wherein the second heavily doped region is coupled to the first low doped region, wherein the second heavily doped region comprises the second conductivity type, wherein the first heavily doped region, the second heavily doped region, and the first low doped region form a PIN diode;
a second low doped region disposed adjacent the first low doped region, the second low doped region comprising the first conductivity type;
a third heavily doped region disposed in the second low doped region, the third heavily doped region comprising the second conductivity type and being coupled to a second power supply potential node; and
a first resistor between the third heavily doped region and the second low doped region.

27. The device of claim 26, wherein the first heavily doped region comprises a $p^+$ region, the first low doped region comprises an n region, and the second heavily doped region comprises an $n^+$ region.

28. The device of claim 26, further comprising a first conductive region disposed above the first low doped region, and disposed between the first and the second heavily doped region, the first conductive region being coupled to the first power supply potential node via a first resistor.

29. The device of claim 28, wherein the second heavily doped region comprises the second conductivity type, wherein the first heavily doped region, the second heavily doped region, the first low doped region, and the first conductive region form a tunnel transistor.

30. The device of claim 29, wherein the first conductive region is coupled to second power supply potential node through a capacitor.

31. The device of claim 28, wherein the second heavily doped region comprises the first conductivity type, wherein the first heavily doped region, the second heavily doped region, the first low doped region, and the first conductive region form a transistor.

32. The device of claim 31, wherein the first conductive region is coupled to second power supply potential node through a capacitor.

33. A semiconductor device comprising:
a first transistor disposed in a first well region, the first transistor disposed between a first and a second power supply potential node, wherein a gate electrode of the first transistor is coupled to the first power supply potential node through a first resistor and the second power supply potential node through a first capacitor;
a thyristor disposed between a first and a second power supply potential node, the thyristor comprising a first, a second, a third, and a fourth doped region, wherein the second doped region and the first well region of the first transistor share a common region; and
a second transistor disposed in a second well region, wherein a first source/drain of a second transistor is coupled to the second doped region, wherein a second source/drain of the second transistor coupled to the second power supply potential node.

34. The device of claim 33, wherein the gate electrode of the second transistor is coupled to the first power supply potential node through a second capacitor and the second power supply potential node through a second resistor.

35. The device of claim 34, wherein the first transistor comprises a PMOSFET, wherein the thyristor comprises a PNPN thyristor, wherein the second transistor comprises a NMOSFET, wherein the first power supply potential node comprises a $V_{DD}$ potential node, and wherein the second power supply potential node comprises a $V_{SS}$ potential node.

36. The device of claim 34, wherein the first and the third doped region comprise a p-type conductivity, and wherein the second and the fourth doped region comprise an n-type conductivity.

37. The device of claim 34, wherein the fourth doped region comprises the second source/drain of the second transistor.

38. The device of claim 34, further comprising a third transistor disposed between the second doped region and the second power supply potential node, wherein a gate electrode of the third transistor is coupled to the first power supply through the second capacitor and the second power supply potential node through the second resistor.

39. The device of claim 38, wherein the first transistor is a PMOS transistor, the second transistor is a NMOS transistor, and the third transistor is an external NMOS transistor.

40. The device of claim 38, wherein the first and the second transistor discharge at least a portion of a electro static discharge voltage pulse by a flow of a first discharge current from the first power supply potential node to the second power supply potential node.

41. The device of claim 38, wherein the thyristor is triggered into a low resistance mode by the triggering of the third transistor, and wherein the thyristor discharges the remaining portion of the electro static discharge voltage pulse by a flow of a second discharge current from the first power supply node to the second power supply potential node.

42. The device of claim 38, wherein the third transistor is replaced by a diode stack to trigger the thyristor.

43. The device of claim 34, further comprising a third transistor between the second doped region and a second power supply potential node, wherein the gate electrode is coupled to the first power supply through the first resistor and the second power supply through the first capacitor, wherein the second source/drain and the gate electrode of the second transistor are directly coupled to the second power supply, and wherein a first source/drain of the second transistor is coupled to the first power supply.

44. The device of claim 43, wherein the first transistor is a PMOS transistor, the second transistor is a NMOS transistor, and the third transistor is an external PMOS transistor.

45. The device of claim 43, wherein the first and the second transistor discharge at least a portion of a electro static discharge voltage pulse by a flow of a first discharge current from the first power supply potential node to the second power supply potential node and from the second power supply potential node to the first power supply potential node.

46. The device of claim 43, wherein the thyristor is triggered into a low resistance mode by the triggering of the third transistor, and wherein the thyristor discharges the remaining portion of the electro static discharge voltage pulse by a flow of a second discharge current from the first power supply node to the second power supply potential node.

47. The device of claim 43, wherein the third transistor is replaced by a diode stack to trigger the thyristor.

48. A semiconductor device comprising:
a first source/drain of a transistor coupled to a node to be protected;
a gate of the transistor coupled to the first power supply potential node through a first resistor;
a thyristor disposed between the node to be protected and a second power supply potential node, wherein the thyristor comprises a first doped region, a second doped region, a third doped region, and a fourth doped region, wherein the fourth doped region is coupled to the second power supply potential node; and
an isolation disposed between the first source/drain region and the fourth doped region, the isolation contacting the first, the second, the third, and the fourth doped regions.

49. The device of claim 48, wherein the second doped region and a body of the transistor share a common region.

50. The device of claim 49, wherein the first doped region and the first source/drain of the transistor share a common region.

51. The device of claim 49, wherein the first and the third doped region comprise a first conductivity type, wherein the second and the fourth doped region comprise a second conductivity type, and wherein the first and the second conductivity type are opposite.

52. The device of claim 48, wherein a second source/drain of the transistor is coupled to a first power supply potential node.

53. The device of claim 52, wherein the second source/drain is coupled to a body of the transistor.

54. The device of claim 48, wherein a second source/drain of the transistor is coupled to a second power supply potential node, and wherein the node to be protected and first power supply potential node is the same node.

55. The device of claim 54, wherein the second source/drain is coupled to an output of the thyristor.

56. The device of claim 48, wherein the first power supply potential node comprises a $V_{DD}$ potential node, and wherein the second power supply node comprises a ground potential node.

57. The device of claim 48, wherein the gate of the transistor is coupled to the second power supply potential node through a capacitor.

58. The device of claim 48, wherein the third doped region and the fourth doped region are coupled together through a second resistor.

59. The device of claim 48, wherein the second doped region and the third doped region contact so as to form a p/n junction.

60. A semiconductor device comprising:
a first doped region disposed in a substrate;
a first source/drain region disposed in the first doped region, the first source/drain region comprising a first conductivity type, and the first doped region comprising a second conductivity type, the first and the second conductivity types being opposite, the first source/drain region being coupled to a node to be protected;
a second source/drain region coupled to a first power supply potential node, the second source/drain region being coupled to the first doped region;
a gate electrode coupled to the first power supply potential node via a trigger circuit, wherein the first and the second source/drain regions, the first doped region, and the gate electrode form a transistor;
a second doped region disposed adjacent the first doped region, the second doped region comprising the first conductivity type; and
a terminal region disposed in the second doped region, the terminal region comprising the second conductivity type and being coupled to a second power supply potential node, wherein the first source/drain region, the first doped region, the second doped region and the terminal region form a thyristor.

61. The device of claim 60, further comprising a resistor between the terminal region and the second doped region and a highly doped region between the resistor and the second doped region.

62. The device of claim 60, wherein the trigger circuit comprises a transistor.

* * * * *

UNITED STATES PATENT AND TRADEMARK OFFICE
CERTIFICATE OF CORRECTION

| | | |
|---|---|---|
| PATENT NO. | : 8,198,651 B2 | Page 1 of 1 |
| APPLICATION NO. | : 12/250436 | |
| DATED | : June 12, 2012 | |
| INVENTOR(S) | : Langguth et al. | |

It is certified that error appears in the above-identified patent and that said Letters Patent is hereby corrected as shown below:

IN THE CLAIMS:

In Col. 17, line 45, claim 27, delete "an n region" and insert --an n⁻ region--.

Signed and Sealed this
Sixteenth Day of October, 2012

David J. Kappos
*Director of the United States Patent and Trademark Office*